United States Patent
Inohara et al.

[19]
[11] Patent Number: 6,163,067
[45] Date of Patent: *Dec. 19, 2000

[54] SEMICONDUCTOR APPARATUS HAVING WIRING GROOVE AND CONTACT HOLE IN SELF-ALIGNMENT MANNER

[75] Inventors: Masahiro Inohara, Tokyo; Hideki Shibata; Tadashi Matsuno, both of Yokohama, all of Japan

[73] Assignee: Kabushiki Kaisha Toshiba, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/224,173

[22] Filed: Dec. 31, 1998

Related U.S. Application Data

[62] Division of application No. 08/720,241, Sep. 26, 1996, Pat. No. 5,976,972.

[30] Foreign Application Priority Data

Sep. 29, 1995 [JP] Japan ................................. 7-253736
Aug. 12, 1996 [JP] Japan ................................. 8-212332

[51] Int. Cl.$^7$ .................................................. H01L 23/535
[52] U.S. Cl. .......................... 257/635; 257/649; 257/774
[58] Field of Search .................................. 257/635, 642, 257/649, 774, 775; 438/634, 640, 701

[56] References Cited

U.S. PATENT DOCUMENTS

| | | | |
|---|---|---|---|
| 4,676,869 | 6/1987 | Lee et al. | 156/643 |
| 4,789,648 | 12/1988 | Chow et al. | 437/225 |
| 4,832,789 | 5/1989 | Cochran et al. | 437/203 |
| 4,999,318 | 3/1991 | Takahumi et al. | 437/194 |
| 5,169,802 | 12/1992 | Yeh | 437/203 |
| 5,203,957 | 4/1993 | Yoo et al. | 156/643 |
| 5,309,023 | 5/1994 | Motonami et al. | 257/773 |
| 5,578,523 | 11/1996 | Fiordalice et al. | 437/190 |
| 5,591,675 | 1/1997 | Kim et al. | 437/195 |
| 5,598,027 | 1/1997 | Matsuura . | |
| 5,604,156 | 2/1997 | Chung et al. | 438/638 |
| 5,635,423 | 6/1997 | Huang et al. | 437/195 |
| 5,656,543 | 8/1997 | Chung | 438/625 |
| 5,730,835 | 3/1998 | Roberts et al. | 257/750 |
| 5,741,626 | 4/1998 | Jain et al. | 430/314 |
| 5,843,845 | 12/1998 | Chung | 438/713 |
| 5,904,565 | 5/1999 | Nguyen et al. | 438/687 |
| 5,926,732 | 7/1999 | Matsuura | 438/622 |
| 5,940,732 | 8/1999 | Zhang | 438/640 |

FOREIGN PATENT DOCUMENTS

| | | |
|---|---|---|
| 0224013 | 6/1987 | European Pat. Off. . |
| 0263220 | 4/1988 | European Pat. Off. . |
| 0435187 | 7/1991 | European Pat. Off. . |
| 0496443 | 7/1992 | European Pat. Off. . |
| 62-290148 | 12/1987 | Japan . |
| 63-275142 | 11/1988 | Japan . |
| 9612297 | 4/1996 | WIPO . |

*Primary Examiner*—David Hardy
*Attorney, Agent, or Firm*—Hogan & Hartson, LLP

[57] ABSTRACT

A semiconductor apparatus and a process for fabricating the same according to the invention permit reduction in width of a wiring pattern of the semiconductor apparatus and in distance between wiring elements. A stopper film and an insulating film are provided on a substrate. The etching rate of RIE for the insulating film is greater than that for the stopper film. The stopper film and insulating film are formed on the insulating film. A pattern of the contact hole is formed in the stopper film. A wiring pattern is formed on the resist film. The insulating films are etched by RIE with the resist film and stopper film used as masks. Thus, a groove for formation of wiring and a contact hole for formation of a contact plug are simultaneously formed in a self-alignment manner.

19 Claims, 15 Drawing Sheets

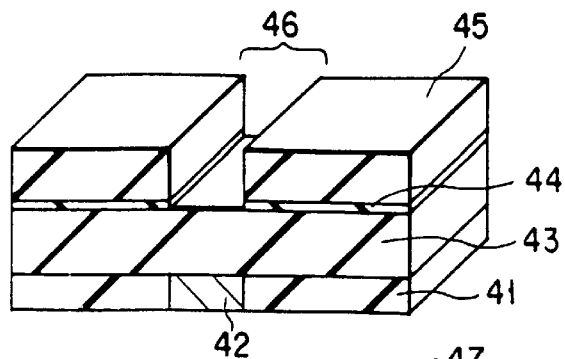
F I G. 5
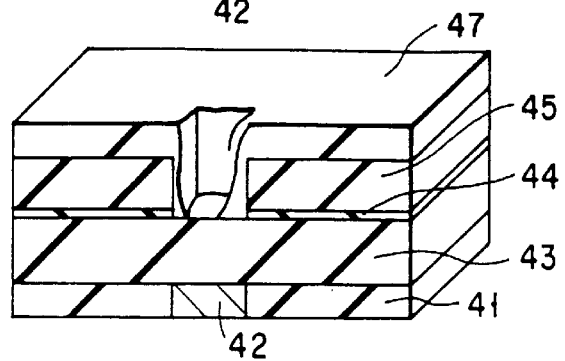
F I G. 6
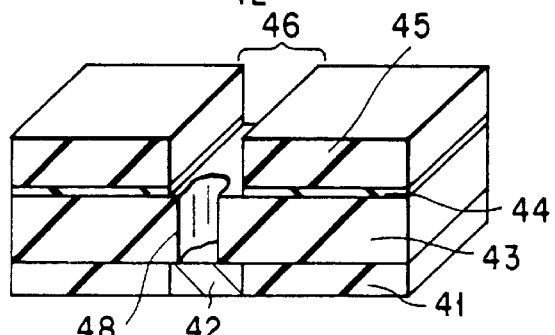
F I G. 7
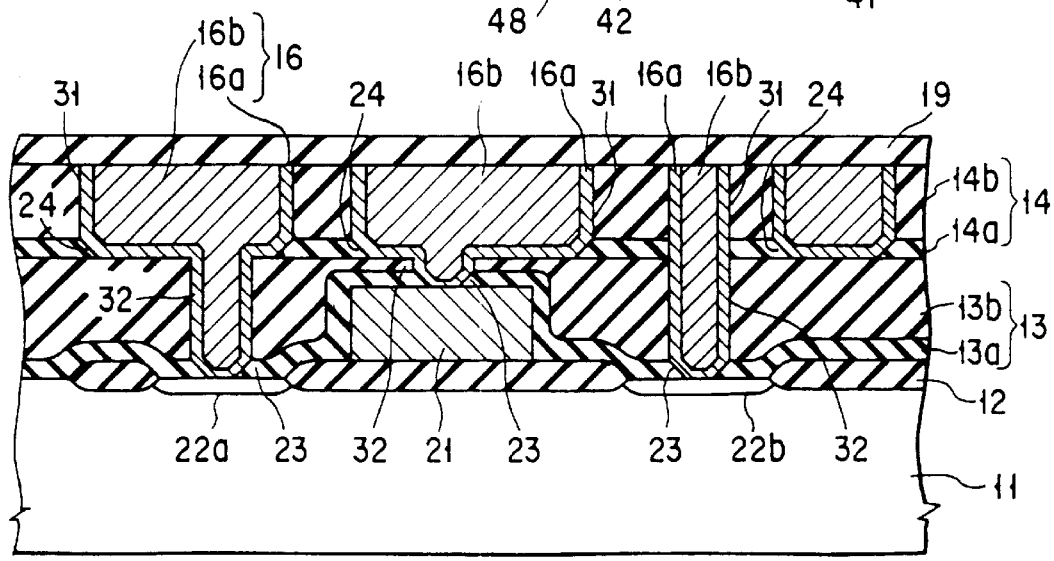
F I G. 12

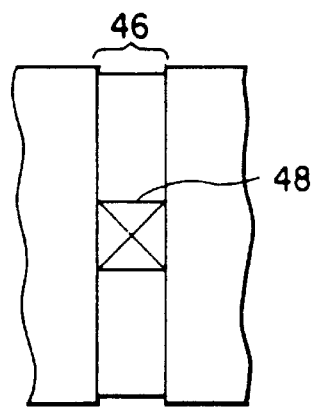
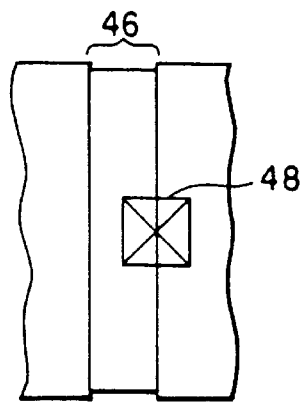
F I G. 8A    F I G. 8B
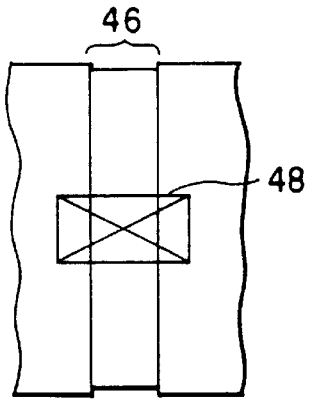
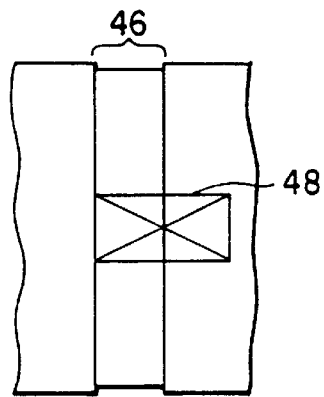
F I G. 9A    F I G. 9B
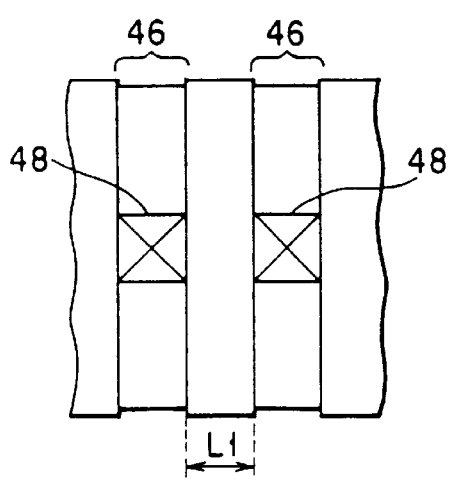
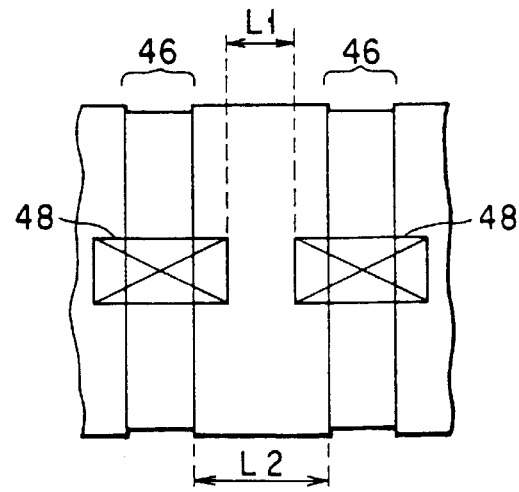
F I G. 10    F I G. 11

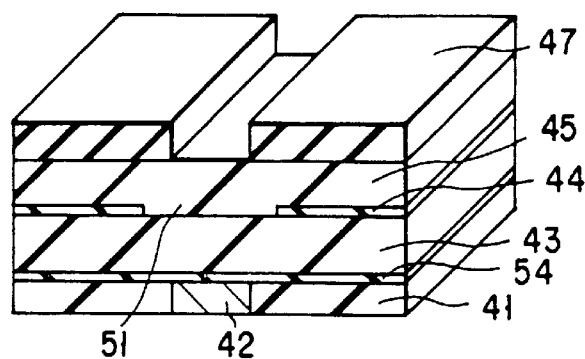
F I G. 29
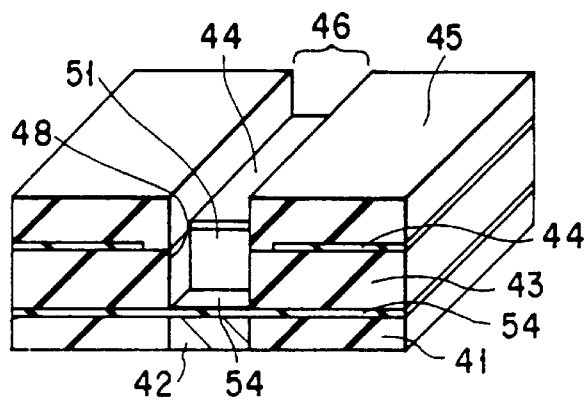
F I G. 30
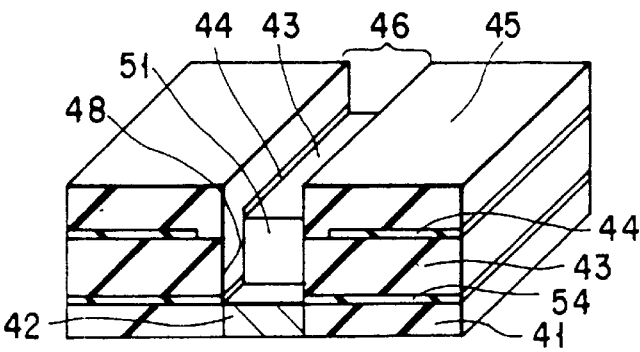
F I G. 31
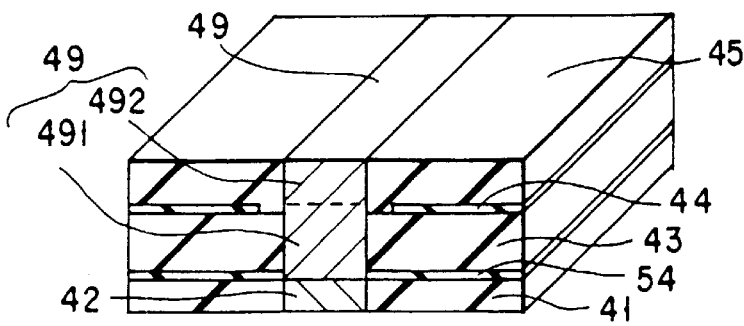
F I G. 32

SEMICONDUCTOR APPARATUS HAVING WIRING GROOVE AND CONTACT HOLE IN SELF-ALIGNMENT MANNER

This is a division of application Ser. No. 08/720,241 filed Sep. 26, 1996, now U.S. Pat. No. 5,976,972, which application is hereby incorporated by reference in its entirety.

BACKGROUND OF THE INVENTION

1. Field of the Invention

The present invention relates to a semiconductor apparatus having a multi-layer wiring structure and a method of fabricating the same. In particular, this invention relates to a semiconductor apparatus having fine wiring and a contact plug between wiring layers formed by means of lithographical techniques and to a method of fabricating the semiconductor apparatus.

2. Description of the Related Art

In a currently prevailing method of forming wiring, a conductor film deposited uniformly on an insulating film is processed by means of lithography and etching and then insulating films are formed between and over wiring elements by means of CVD. In this method, however, it becomes difficult to achieve an exact wiring process or fill insulating films among wiring elements as the width of each wiring element and the pitch of wiring elements decrease due to higher integration density of semiconductor integrated circuits. To solve this problem, attention has been paid to a so-called Damascene method in which wiring is formed by burying conductor elements in grooves formed in insulating films.

FIGS. 1 to 3 illustrate the steps of a wiring forming process to which the Damascene method is applied.

As is shown in FIG. 1, a field oxide film 12 is formed on a silicon substrate 11. For example, a MOS transistor is formed in a device region surrounded by the field oxide film. Silicon oxide films 13 and 14 are formed over the entire surface of the silicon substrate 11. The silicon oxide film 14 is processed by a photolithographical step and an etching step to form grooves 31 in which wiring is formed (hereinafter referred to as "wiring grooves 31"). Subsequently, the silicon oxide film 13 is processed by a photolithographical step and an etching step to form contact holes 32 extending downward from the bottoms of the wiring grooves 31 to a gate electrode 21 and source/drain regions 22a and 22b of the MOS transistor.

As is shown in FIG. 2, a conductor film 16 is formed over the entire surface of the resultant structure. The conductor film 16 is polished by means of CMP (chemical mechanical polishing) until the conductor film 16 is left only within the wiring grooves 31 and contact holes 32.

Then, as shown in FIG. 3, silicon oxide films 17 and 18 are formed on the silicon oxide film 14 and conductor film 16. The silicon oxide film 18 is processed by a photolithographical step and an etching step to form grooves 33 in which wiring is formed (hereinafter referred to as "wiring grooves 33"). Subsequently, the silicon oxide film 17 is processed by a photolithographical step and an etching step to form contact holes 34 extending downward from the bottoms of the wiring grooves 33 to the conductor film 16. Then, a conductor film 20 is formed over the entire surface of the resultant structure. The conductor film 20 is polished by means of CMP (chemical mechanical polishing) until the conductor film 20 is left only within the wiring grooves 33 and contact holes 34. A wiring protection film 19 is formed on the silicon oxide film 18 and conductor film 20.

In the above wiring forming process, the photolithographical and etching steps are carried out to form the wiring grooves 31 and 33 for the formation of wiring and the contact holes 32 and 34 formed in the bottoms of wiring grooves 31 and 33 for contact between the lower wiring layer and the upper wiring layer.

In the photolithographical steps of forming the contact holes 32 and 34, as shown in FIG. 4, formation of a resist film 35 with high resolution is difficult due to the presence of stepped portions of the wiring grooves 31 and 33.

In addition, the bottom face of side face of each groove 31, 33 formed in the silicon oxide film 14, 18 are perpendicular to each other, and also the bottom face and side face of each contact hole 32, 34 formed in the silicon oxide film 13, 17 are perpendicular to each other. As a result, coverage of the conductor film 16 and 20 is degraded.

The problem illustrated in FIG. 4, i.e. the difficulty in obtaining resist film 35 with high resolution, will now be described in greater detail with reference to other FIGURES.

FIGS. 5 to 7 are cross-sectional perspective views illustrating in succession the steps of a conventional process for forming a contact hole.

As is shown in FIG. 5, a lower wiring element 42 is formed in an insulating film 41 provided on a semiconductor substrate. An insulating film 43, an etching stopper film 44 and an insulating film 45 are laminated in succession on the insulating film 41 including the lower wiring element 42. A groove 46 for formation of an upper wiring element is formed in a predetermined region of the insulating film 45. The wiring groove 46 is located above the lower wiring element 42. Anisotropical etching for forming the groove 46 is stopped by the etching stopper film 44. The exposed etching stopper film 44 is removed.

Then, a photolithographical step is initiated, as shown in FIG. 6. A resist film 47 is applied to the insulating film 45 with the groove 46. That portion of the resist film 47, which is located in a predetermined region of the groove 46, needs to be removed by exposing and developing the resist film 47 with use of a patterning mask (not shown). In this case, the thickness of the applied resist film 47 is inevitably non-uniform due to the presence of stepped portions of the groove 46. That is, the resist film 47 formed in the groove 46 is thicker than the resist film 47 formed on the insulating film 45.

Consequently, as shown in FIG. 6, when the resist film 47 is patterned, an exact resist pattern is not obtained due to a deficient exposure time on a thick portion of the resist film 47 and a focus error resulting from a difference in distance between a stepper lens (not shown) and the resist film 47. Thus, the lithographical resolution may deteriorate.

As is shown in FIG. 7, with the resist film 47 used as mask, a contact hole 48 extending to the lower wiring element 42 is formed by subjecting the insulating film 43 to anisotropical etching. Since the resist pattern is not precise, the area of contact with the lower wiring element 42, which is provided by the contact hole 48, decreases. Furthermore, if the pattern on the resist film for forming the wiring groove or-contact hole is displaced, the area of contact with the upper wiring element will considerably decrease.

Another problem in conventional devices will now be described. FIGS. 8A and 8B are plan views showing a first relationship between the wiring groove 46 and the contact hole 48. In the first relationship, the length of one side of the contact hole 48 is substantially equal to the width of the wiring element formed in the wiring groove 46. FIG. 8A shows a normal position of the contact hole 48, and FIG. 8B shows an abnormal position thereof due to a lithographical alignment error. In FIG. 8B, the contact area between a contact plug (buried in the contact hole) and the wiring element decreases, as compared to the design pattern (FIG. 8A).

According to the above structure, the decrease in contact area between the upper wiring element and the contact plug due to the lithographical alignment error results in an increase in resistance in the circuit operation of the semiconductor apparatus. Consequently, the performance of the semiconductor apparatus deteriorates and the reliability of the device lowers due to an increase in current density.

FIGS. 9A and 9B are plan views showing a second relationship between the wiring groove 46 and the contact hole 48. In the second relationship, the length of one side of the contact hole 48 is greater than the width of the wiring element formed in the wiring groove 46. FIG. 9A shows a normal position of the contact hole 48, and FIG. 9B shows an abnormal position thereof due to a lithographical alignment error. In FIG. 9B, even if an alignment error occurs to some degree in the lithographical step, the width of the contact hole has a tolerance and the contact area according to the design pattern is obtained between the contact plug and the wiring element.

In the case of FIGS. 9A and 9B, if mutually opposed contact plugs are provided on juxtaposed wiring elements, the interval of the wiring elements must be increased because of the limit of lithographical resolution. This problem will now be explained with reference FIGS. 10 and 11.

In an ideal state as shown in FIG. 10, the contact holes 48 shown in FIGS. 8A and 8B can be arranged at an interval of a lithographic resolution limit space L1 for the wiring grooves (or contact holes). In fact, however, the structure shown in FIGS. 9A and 9B which can cancel the alignment error is adopted. In this case, in consideration of the lithographical alignment error, the transverse length of each contact plug is made greater than the width of the wiring element. Thus, the space between the wiring grooves must be set at space L2 which is greater than space L1, with the result that the integration density of semiconductor devices decreases.

The problems of the prior art will now be summarized. In general, in the prior art, when the contact hole for contact between the upper wiring groove for formation of the upper wiring element and the lower wiring element is formed in the interlayer insulating film, all insulating films are deposited and then the resist patterning for forming the groove and the resist patterning for forming the contact hole are carried out. Since the photoresist film is applied to the stepped portion of the groove, the thickness of the resist becomes non-uniform. In the photolithographing step, the precision of the resist pattern deteriorates.

Furthermore, if a mask alignment error occurs, the are a of contact between the contact plug and upper wiring decreases. In addition, the bottom and side wall of the contact hole as well as the bottom and side wall of the wiring groove, are perpendicular to each other, and the coverage of the buried conductor member deteriorates and the lifetime of wiring decreases.

In the case where mutually opposed plugs are provided on juxtaposed wiring elements, if the width of each plug is made greater than that of the wiring element in order to cancel the mask alignment error in the photolithographing step, the space between the wiring elements must be increased because of the limit of lithographical resolution. Consequently, the integration density will decrease.

SUMMARY OF THE INVENTION

An object of the present invention is to provide a semiconductor apparatus and a process for fabricating the same, wherein a conductor member can be reliably buried in a contact hole or a wiring groove even if the width of a wiring element and the distance between wiring elements is reduced due to higher integration density of semiconductor integrated circuits, and thus high precision, high integration density, high yield and low cost can be achieved and a multi-layer wiring structure of the next generation can be realized.

The object can be achieved by a semiconductor apparatus comprising:

a first conductive region provided at one of a region in a semiconductor substrate and a region on the semiconductor substrate;

a second conductive region provided above the first conductive region;

an interlayer insulating film provided between the first and second conductive regions;

an insulating protection film provided in the interlayer insulating film and having an etching rate different from that of the interlayer insulating film, the protection film having an opening region;

a contact hole penetrating the interlayer insulating film through the opening region in the protection film; and a conductor member for electrically connecting the first conductive region and the second conductive region via the contact hole, wherein the contact hole has dimensions common to those of the second conductive region and the opening region in a direction in which the contact hole penetrates from the opening region of the protection film to the first conductive region.

The object of the invention can also be achieved by a process for fabricating a semiconductor apparatus having a contact plug for electrically connecting a portion of a first conductive region and a portion of a second conductive region provided above the first conductive region with an interlayer insulating film interposed, the process comprising the steps of:

forming a first insulating film constituting a part of the interlayer insulating film;

providing an insulating protection film on the first insulating film, the insulating protection film having an etching rate different from that of the first insulating film;

forming an opening region including a formation region for the contact plug in the protection film;

forming a second insulating film constituting a part of the interlayer insulating film and covering the protection film and the opening region; and etching the second insulating film, thereby forming a groove for the second conductive region, the groove having a bottom defined by the protection film, and etching the first insulating film through the opening region of the protection film which overlaps the groove, thereby forming a contact hole reaching the first conductive region.

According to the present invention, the contact hole is formed in a self-alignment manner through an opening region of the protection film overlapping the formed second conductive region. A lithographing step for forming the second conductive region can be performed on a surface with little stepped portion. Thus, a high-precision resist pattern is formed and the integration density of semiconductor devices can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5 to 7 are cross-sectional perspective views illustrating in succession the steps of forming a contact hole in the conventional process;

FIGS. 8A and 8B are plan views illustrating a relationship between a wiring groove and a contact hole;

FIGS. 9A and 9B are plan views illustrating another relationship between a wiring groove and a contact hole;

FIG. 10 is a plan view illustrating a relationship between wiring grooves and contact holes formed in a lithographing step with a resolution limit space provided between the wiring grooves;

FIG. 11 is a plan view illustrating a relationship between wiring grooves and contact holes formed in a lithographing step, the contact holes being designed to cancel a lithographic alignment error;

FIG. 12 is a cross-sectional view showing a semiconductor apparatus according to a first embodiment of the present invention;

FIGS. 28 to 32 are cross-sectional views illustrating in succession the steps of a process for fabricating a semiconductor apparatus according to an eighth embodiment of the invention;

DETAILED DESCRIPTION OF PREFERRED EMBODIMENTS

Figure 1:
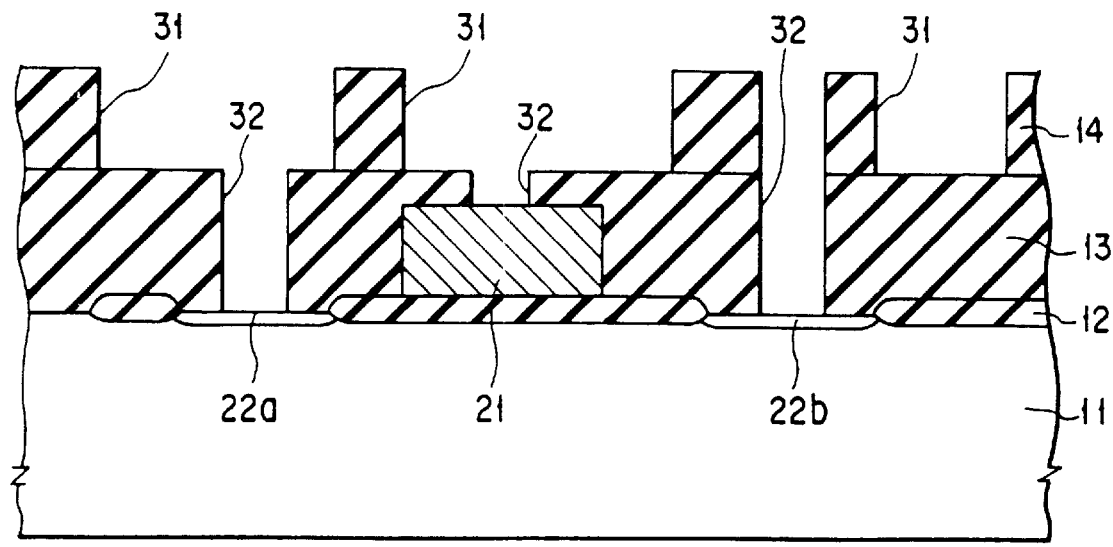
FIGS. 1 to 3 are cross-sectional views generally illustrating in succession the steps of a process for fabricating a conventional semiconductor apparatus.
Figure 2:
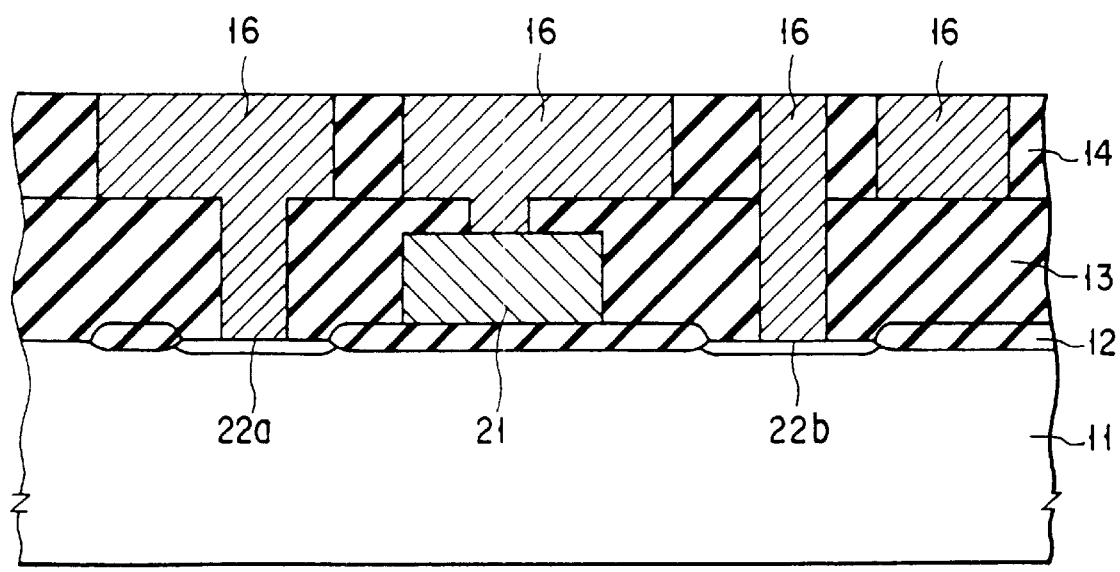
Figure 3:
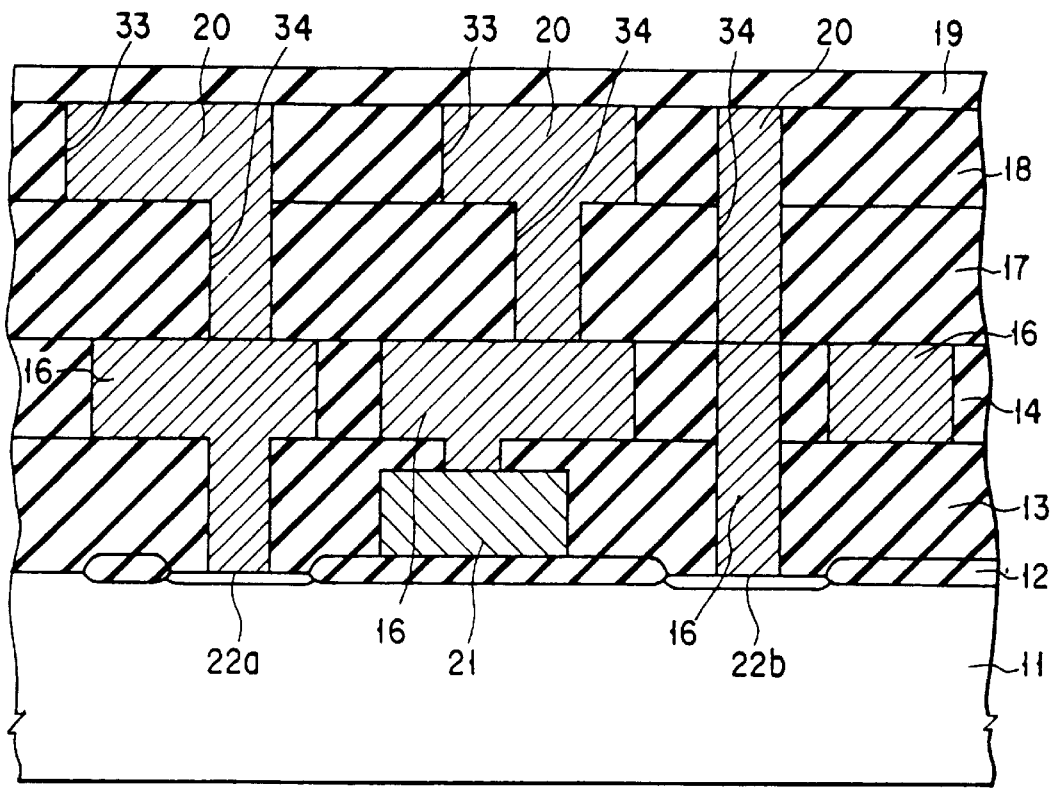
Figure 4:
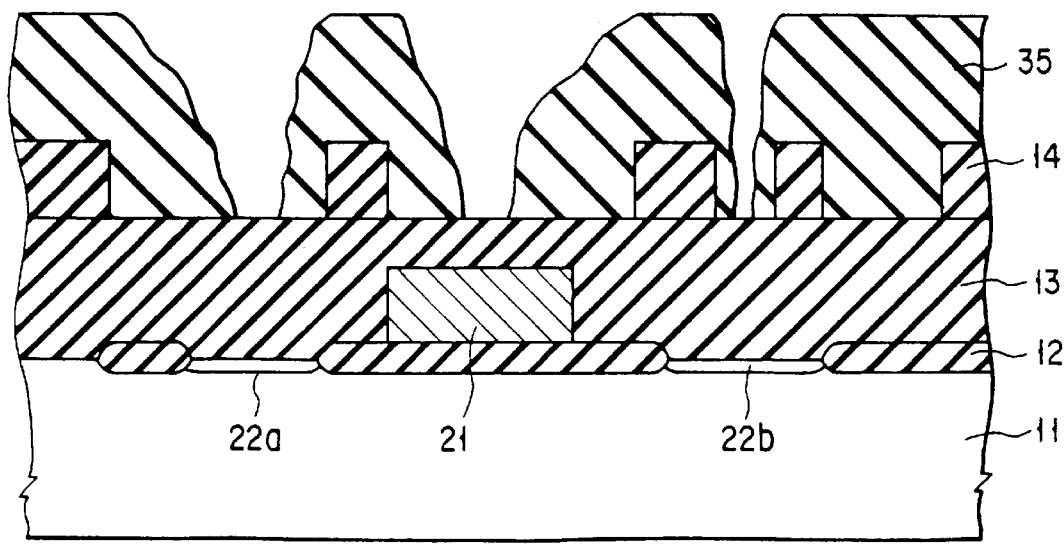
FIG. 4 is a cross-sectional view illustrating an intermediate step in the process illustrated in FIGS. 1 to 3, in which a problem arises.

FIG. 12 is a cross-sectional view showing a semiconductor apparatus according to a first embodiment of the invention. A field oxide film 12 is formed on a silicon substrate 11. For example, a MOS transistor is formed in a device region surrounded by the field oxide film 12. In FIG. 12, a gate electrode 21 of the MOS transistor extends over the field oxide film 12. Conductor members for electrical contact are connected to the gate electrode 21 and source/drain regions 22a and 22b.

A stopper film 13a about 0.2 µm thick, which is formed of, e.g. SiN, SiON or $SiO_2$ containing impurities, is provided over the entire surface of the resultant structure. An insulating film 13b about 1.2 µm thick is provided on the stopper film 13a. The stopper film 13a is a protection film against etching. It is necessary that the etching rate of RIE (Reactive Ion Etching) for the stopper film 13a be lower than that for the insulating film 13b. The surface of the insulating film 13b is flattened.

A stopper film 14a about 0.2 µm thick, which is formed of, e.g. SiN, SiON or $SiO_2$ containing impurities, is provided over the entire surface of the insulating film 13. An insulating film 14b about 1.5 µm thick is provided on the stopper film 14a. The stopper film 14a is a protection film against etching. It is necessary that the etching rate of RIE (Reactive Ion Etching) for the stopper film 14a be lower than that for the insulating film 14b. The surface of the insulating film 14b is flattened.

Wiring grooves 31 for formation of wiring elements are formed in the insulating film 14b and stopper film 14a. The stopper film 14a has tapered portions 24 at corners defined by bottom faces and side faces of the grooves 31, thereby removing rectangular portions from the corners. Specifically, the tapered surface of each tapered portion 24 intersects with the bottom face and side face of the associated groove 31 at an obtuse angle.

Contact holes 32 are formed in the insulating film 13b and stopper film 13a. The contact holes 32 extend downward from the bottoms of the wiring grooves 31 to the gate electrode 21 and source/drain regions 22a and 22b.

The stopper film 13a has tapered portions 23 at corners defined by bottom faces and side faces of the contact holes 32, thereby removing rectangular portions from the corners. Specifically, the tapered surface of each tapered portion 23 intersects with the bottom face and side face of the associated contact hole 32 at an obtuse angle.

Underlayer films 16a (formed of, e.g. Ti, Co, W, or SiN) having a thickness of about 0.1 μm are formed on the inner walls of the grooves 31 and contact holes 32. The underlayer films 16a are formed on the inner walls of grooves 31 (including the tapered surfaces of stopper film 14a) and the inner walls of contact holes 32 (including the tapered surfaces of stopper film 13a) with good coverage.

Conductor members 16b (formed of, e.g. Al—Cu—Si, Al—Cu, Cu, etc.) are formed on the underlayer films 16a and filled in the grooves 31 and contact holes 32. Wiring elements and contact plugs are formed of the underlayer films 16a and conductor members 16b. An insulating film 19 for protecting wiring is provided over the insulating film 14b, conductor members 16b and exposed portions of the underlayer films 16a.

According to the semiconductor apparatus having the above structure, the upper-side wiring elements and lower-side contact plugs can be integrally formed through the same steps, and the manufacturing cost is reduced. In addition, the stopper films 13a and 14a have the tapered portions at the corner regions of the wiring grooves and contact holes. Specifically, the bottom face and side face of each of the grooves 31 and contact holes 32 intersect with the tapered surface of the tapered portion of the associated stopper film 13a, 14a at an obtuse angle.

Accordingly, the wiring underlayer films 16a can be formed on the inner walls of grooves 31 (including the tapered surfaces of stopper film 14a) and the inner walls of contact holes 32 (including the tapered surfaces of stopper film 13a) with good coverage.

Figure 13:
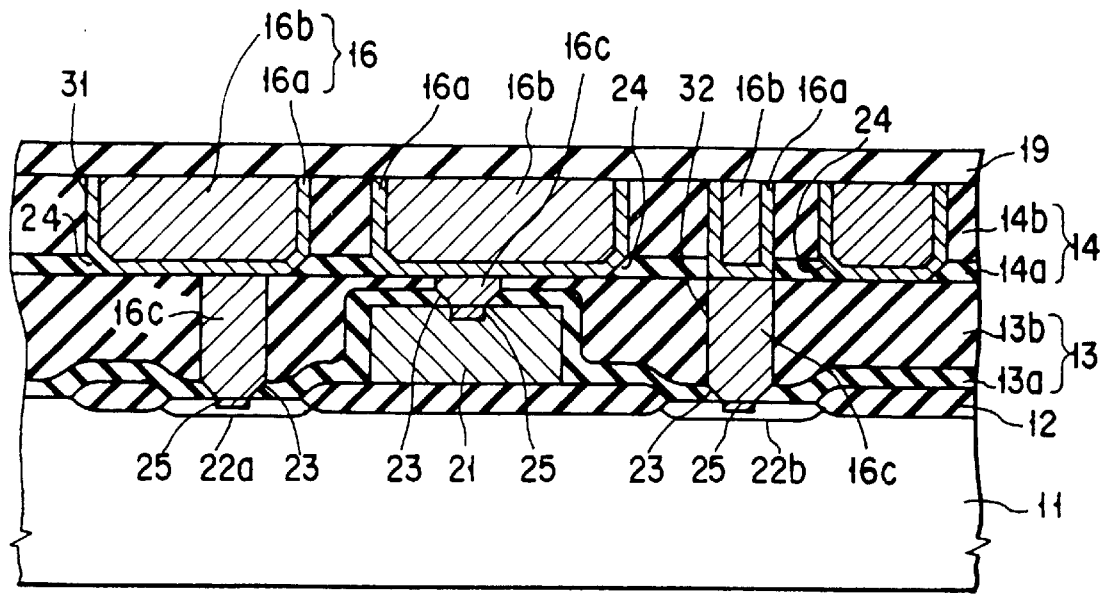
FIG. 13 is a cross-sectional view showing a semiconductor apparatus according to a second embodiment of the present invention.

FIG. 13 is a cross-sectional view showing a semiconductor apparatus according to a second embodiment of the invention. FIG. 13 shows a part of the semiconductor apparatus similar to that shown in FIG. 12.

A field oxide film 12 is formed on a silicon substrate 11. For example, a MOS transistor is formed in a device region surrounded by the field oxide film 12.

A stopper film 13a about 0.2 μm thick, which is formed of, e.g. SiN, SiON or SiO$_2$ containing impurities, is provided over the entire surface of the resultant structure. An insulating film 13b about 1.2 μm thick is provided on the stopper film 13a. It is necessary that the etching rate of RIE (Reactive Ion Etching) for the stopper film 13a be lower than that for the insulating film 13b. The surface of the insulating film 13b is flattened.

A stopper film 14a about 0.2 μm thick, which is formed of, e.g. SiN, SiON or SiO$_2$ containing impurities, is provided over the entire surface of the insulating film 13b. An insulating film 14b about 1.5 μm thick is provided on the stopper film 14a. It is necessary that the etching rate of RIE (Reactive Ion Etching) for the stopper film 14a be lower than that for the insulating film 14b. The surface of the insulating film 14b is flattened.

Wiring grooves 31 for formation of wiring elements are formed in the insulating film 14b and stopper film 14a. The stopper film 14a has tapered portions 24 at corners defined by bottom faces and side faces of the grooves 31, thereby removing rectangular portions from the corners. Specifically, the tapered surface of each tapered portion 24 intersects with the bottom face and side face of the associated groove 31 at an obtuse angle.

Contact holes 32 are formed in the insulating film 13b and stopper film 13a. The contact holes 32 extend downward from the bottoms of the wiring grooves 31 to the gate electrode 21 and source/drain regions 22a and 22b.

The stopper film 13a has tapered portions 23 at corners defined by bottom faces and side faces of the contact holes 32, thereby removing rectangular portions from the corners. Specifically, the tapered surface of each tapered portion 23 intersects with the bottom face and side face of the associated contact hole 32 at an obtuse angle.

Conductor members 16c (formed of, e.g. W) are filled in the contact holes 32 formed in the insulating film 13. Silicide layers (of, e.g. titanium silicide) 25 are formed in the source/drain regions 22a and 22b just under the conductor members 16c.

Underlayer films 16a (formed of, e.g. Ti, Co, W, or SiN) having a thickness of about 0.1 μm are provided on the inner walls of the grooves 31 formed in the insulating film 14 and contact holes 32. The underlayer films 16a are formed on the inner walls of grooves 31 (including the tapered surfaces of stopper film 14a) and the inner walls of contact holes 32 with good coverage.

Conductor members 16b (formed of, e.g. Al—Cu—Si, Al—Cu, Cu, etc.) are formed on the underlayer films 16a and filled in the grooves 31. Wiring elements are formed of the underlayer films 16a and conductor members 16b. An insulating film 19 for protecting wiring is provided over the insulating film 14b, conductor members 16b and exposed portions of the underlayer films 16a.

According to the semiconductor apparatus having the above structure, the stopper films 13a and 14a have the tapered portions at the corner regions of the wiring grooves and contact holes. Specifically, the bottom face and side face of each of the grooves 31 and contact holes 32 intersect with the tapered surface of the tapered portion of the associated stopper film 13a, 14a at an obtuse angle.

Accordingly, the wiring underlayer films 16a can be formed on the inner walls of grooves 31 (including the tapered surfaces of stopper film 14a) with good coverage, and the conductor members 16b and 16c can be completely filled in the grooves 31 and contact hole 32.

Figure 14:
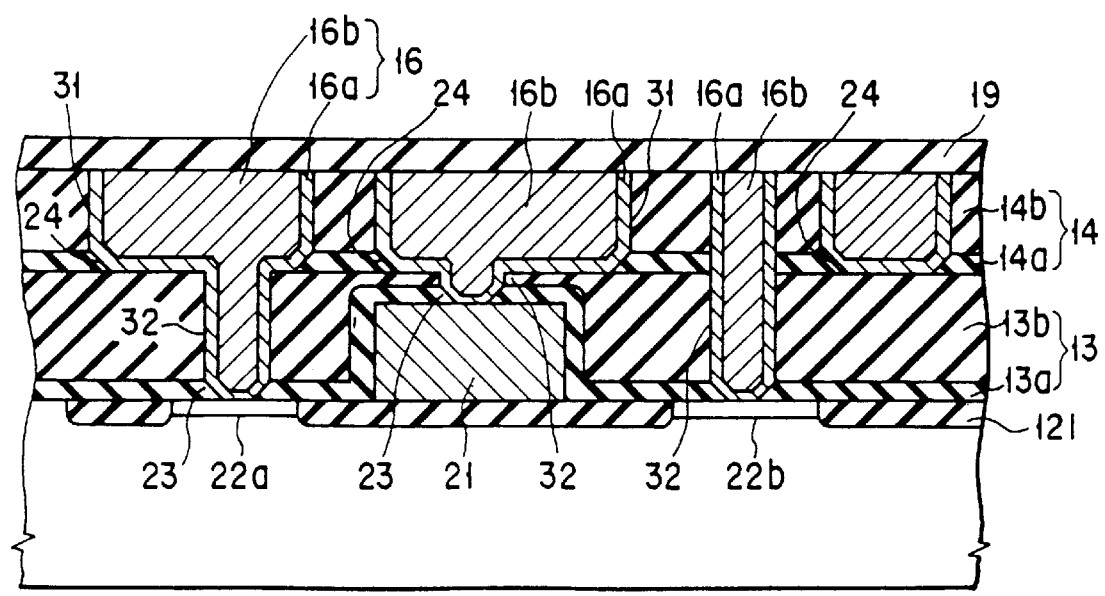
FIG. 14 is a cross-sectional view showing a semiconductor apparatus according to a third embodiment of the present invention.

FIG. 14 is a cross-sectional view showing a semiconductor apparatus according to a third embodiment of the invention. This apparatus is a modification of the apparatus shown in FIG. 12 (first embodiment). The third embodiment differs from the first embodiment only in that the field oxide film 12 is replaced with a buried oxide film 121 buried in the silicon substrate 11. With the structure in FIG. 14, the same advantages as with the semiconductor apparatus according to the first embodiment can be obtained.

Figure 15:
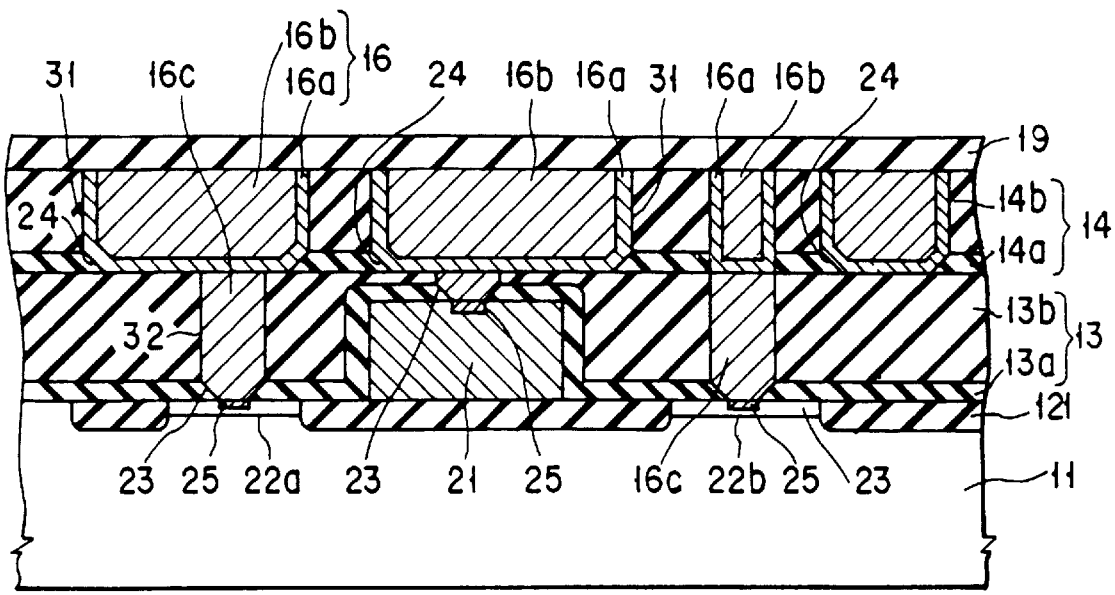
FIG. 15 is a cross-sectional view showing a semiconductor apparatus according to a fourth embodiment of the present invention.

FIG. 15 is a cross-sectional view showing a semiconductor apparatus according to a fourth embodiment of the invention. This apparatus is a modification of the apparatus shown in FIG. 13 (second embodiment). The fourth embodiment differs from the second embodiment only in that the field oxide film 12 is replaced with a buried oxide film 121 buried in the silicon substrate 11. With the structure in FIG. 15, the same advantages as with the semiconductor apparatus according to the second embodiment can be obtained.

A process for fabricating a semiconductor apparatus according to a fifth embodiment of the invention will now be described. The semiconductor apparatus as shown in FIG. 12 will be fabricated by the process according to the fifth embodiment.

Figure 16:
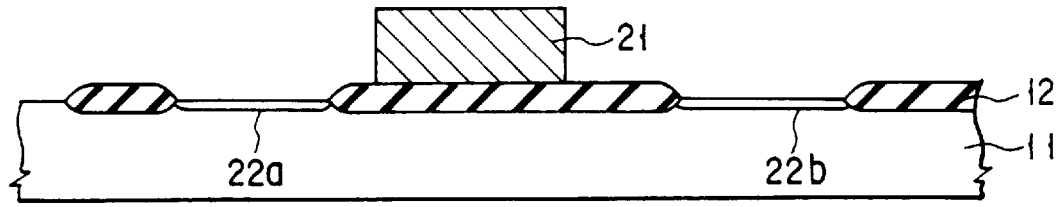
FIGS. 16 to 22 are cross-sectional views illustrating in succession the steps of a process for fabricating a semiconductor apparatus according to a fifth embodiment of the invention.

As is shown in FIG. 16, a field oxide film 12 is formed on a silicon substrate 11 by means of LOCOS (Local Oxidation of Silicon). For example, a MOS transistor is to be formed in a device region surrounded by the field oxide film 12. Reference numeral 21 denotes a gate electrode of the MOS transistor extending over the field oxide film 12. Numerals 22a and 22b denote sour/drain regions of the MOS transistor.

Figure 17:
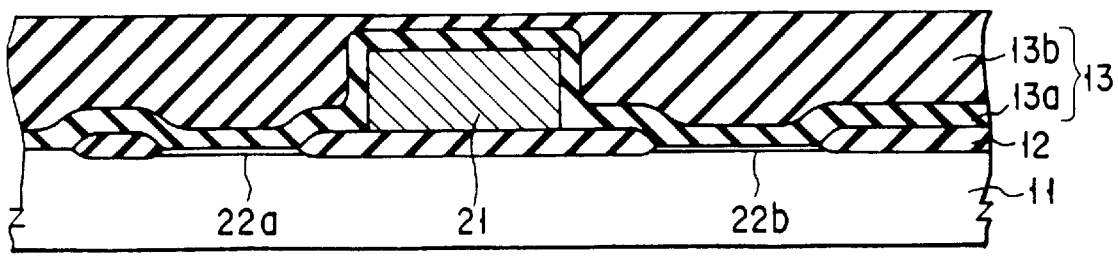

Then, as shown in FIG. 17, a stopper film 13a about 0.2 μm thick, which is formed of, e.g. SiN, SiON or $SiO_2$ containing impurities, is provided over the entire surface of the resultant structure by means of plasma CVD. An insulating film 13b of, e.g. $SiO_2$, which is about 1.2 μm thick, is provided on the stopper film 13a by means of plasma CVD. The upper surface of the insulating film 13b is flattened by means of flattening techniques such as CMP (chemical mechanical polishing), a resist etch-back method, etc.

It is necessary that the etching rate of RIE (Reactive Ion Etching) for the stopper film 13a be lower than that for the insulating film 13b. If the insulating film 13b is sufficiently thick, the step of flatting the insulating film 13b is not necessarily required.

Figure 18:
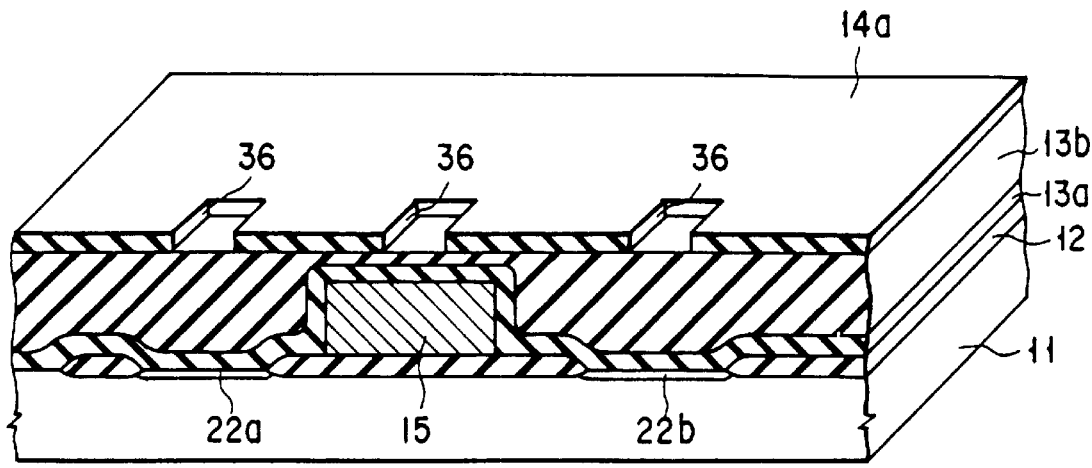

As is shown in FIG. 18, a stopper film 14a about 0.2 μm thick, which is formed of, e.g. SiN, SiON or $SiO_2$ containing impurities, is provided over the entire surface of the insulating film 13b by means of plasma CVD. Contact holes 36 are formed in the stopper film 14a by means of techniques of lithography and RIE.

Figure 19:
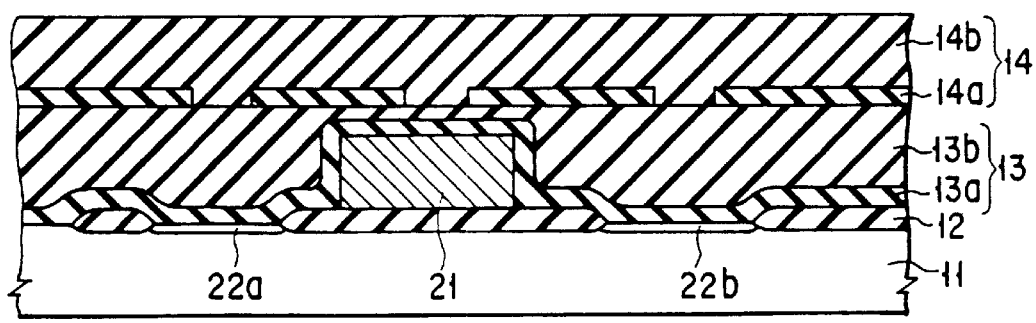

As is shown in FIG. 19, an insulating film 14b of, e.g. $SiO_2$, which is about 1.5 μm thick, is provided on the stopper film 14a by means of plasma CVD. Subsequently, the upper surface of the insulating film 14b is flattened by means of flattening techniques such as CMP (chemical mechanical polishing), a resist etch-back method, etc.

It is necessary that the etching rate of RIE (Reactive Ion Etching) for the stopper film 14a be lower than that for the insulating film 14b. If the insulating film 14b is sufficiently thick, the step of flatting the insulating film 14b is not necessarily required.

Figure 20:
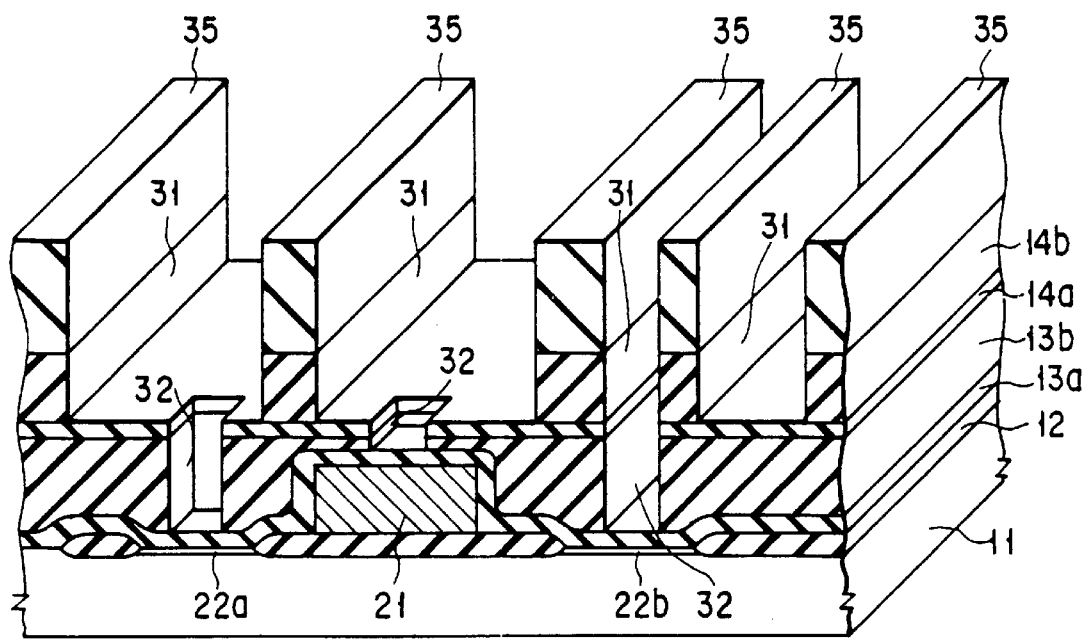

As is shown in FIG. 20, a resist film 35 is provided over the insulating film 14b and the resist film 35 is patterned by means of lithography, thereby forming a wiring pattern on the resist film 35. Using RIE, the insulating film 14b and insulating film 13b are simultaneously etched. Thus, grooves 31 having the same pattern as a wiring pattern are formed in the insulating film 14b, and contact holes 32 for formation of contact plugs are formed in the insulating film 13b.

In this case, the etching rates of RIE (Reactive Ion Etching) for the stopper films 13a and 14a are lower than those for the insulating films 13b and 14b, respectively. Thus, the stopper films 13a and 14a serve as stoppers for RIE, and the stopper film 14a serves as etching mask for forming contact holes 32.

Accordingly, the wiring grooves 31 and the contact holes 32 for formation of the contact plugs for connecting the upper and lower wiring elements (or the wiring element and the substrate) can be simultaneously formed. Since the contact holes 32 can be formed in a self-alignment manner, the manufacturing cost can be reduced.

Since the resist film 35 is provided on the flat insulating film 14b, a precise wiring pattern (or groove pattern) can be formed on the insulating film 14b. Specifically, the grooves 31 and contact holes 32 can be formed according to predetermined design dimensions, and miniaturization of devices can be achieved.

Figure 21:
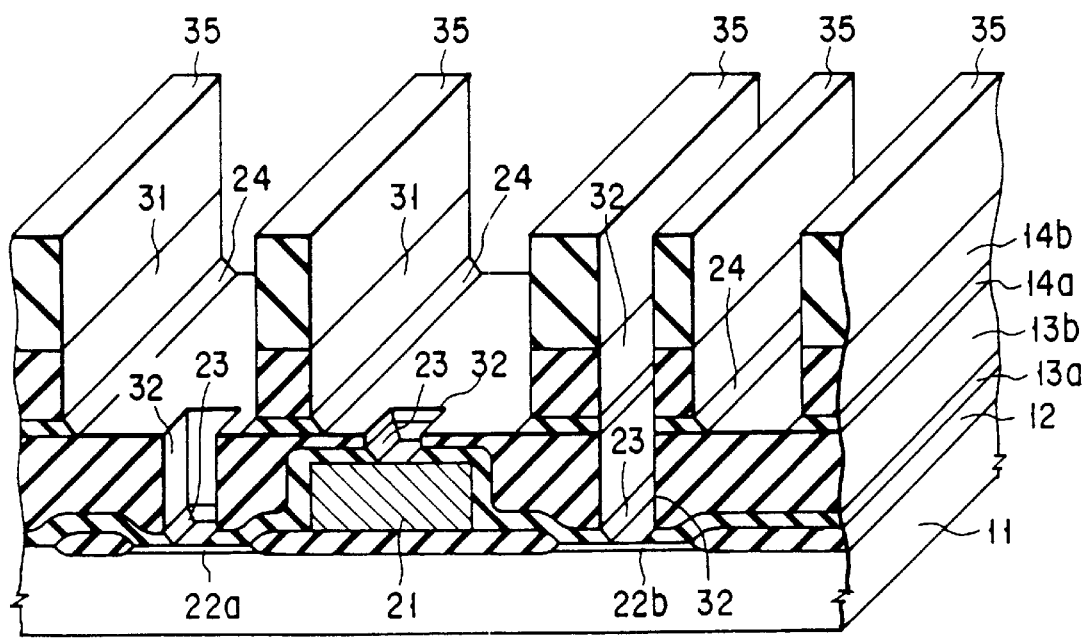

In FIG. 21, those portions of the stopper films 13a and 14a, which are located on the bottoms of the grooves 31 and contact holes 32 are etched away by RIE. In this case, the RIE is performed under conditions necessary for forming side-wall protection films during the etching. For example, one condition for forming the side-wall protection films during the etching is that RIE is performed in an atmosphere of carbon fluoride (CFx).

As a result, the stopper film 14a has tapered portions at the corners defined between the bottom faces and side faces of the grooves 31. In other words, the bottom face and side face of each of the grooves 31 intersect with the tapered surface of the associated tapered portion of the stopper film 14a at an obtuse angle. Similarly, the stopper film 13a has tapered portions at the corners defined between the bottom faces and side faces of the contact holes 32. In other words, the bottom face and side face of each of the contact holes 32 intersect with the tapered surface of the associated tapered portion of the stopper film 13a at an obtuse angle. Thereafter, the resist film 35 is removed.

Figure 22:
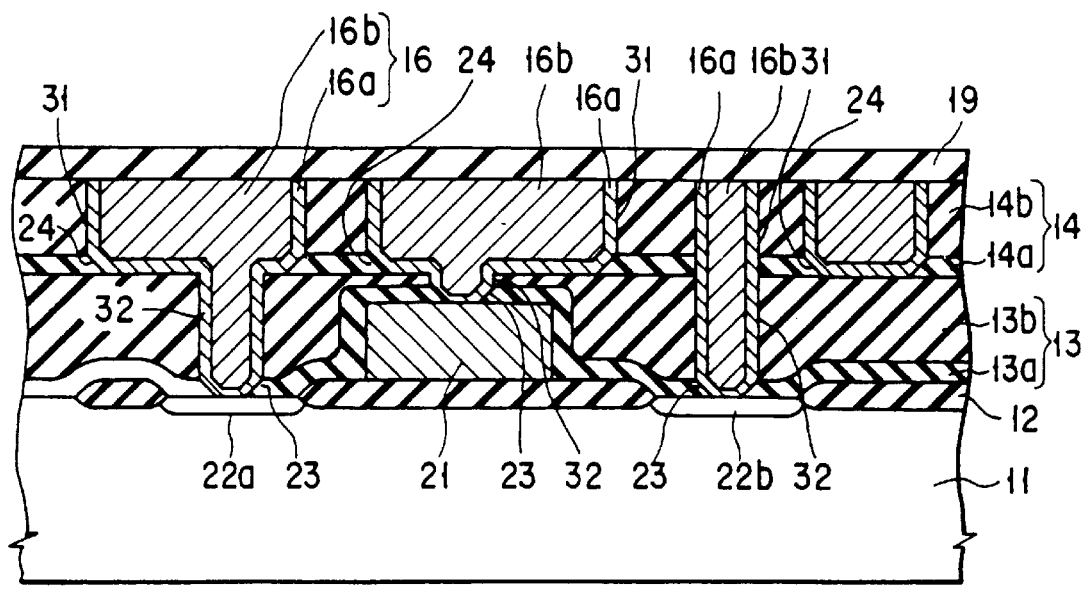

Underlayer 16a about 0.1 μm thick (formed of, e.g. Ti, Co, W, or SiN) for wiring elements and contact plugs are formed by means of sputtering or CVD, as shown in FIG. 22. In this case, since the stopper films 13a and 14a have the tapered portions at the corners of the grooves 31 and contact holes 32, the underlayer films 16a are provided on the inner walls of the grooves 31 and contact holes 32 with good coverage. Then, conductor members 16b about 2.0 μm thick (formed of, e.g. Al—Cu—Si, Al—Cu, or Cu) are formed on the underlayer films 16a by means of sputtering or CVD. Excess portions of the conductor members 16b are removed by means of CMP (Chemical Mechanical Polishing) and the conductor members 16b are left only in the grooves 31 and contact holes 32. Thus, wiring elements and contact plugs are simultaneously formed. A wiring protection film (formed of, e.g. $SiO_2$) about 0.3 μm thick is then formed by means of plasma CVD.

According to the above-described process for fabricating the semiconductor apparatus, the wiring grooves 31 are formed by using the resist film 35 as mask. The contact holes 32 in which the contact plugs are to be formed in a self-alignment manner in relation to the grooves 31 are formed by using the resist film 35 and stopper film 14a as masks. Thus, the wiring pattern (grooves) and contact plug pattern (contact holes) are formed at the same time, and the number of the manufacturing steps is reduced, thus reducing the manufacturing cost.

In addition, the stopper films 13a and 14a are provided with the tapered portions at the corners of the grooves 31 and contact holes 32. Specifically, the bottom face and side face of each of the contact holes 32 intersect with the tapered surface of the associated tapered portion of the stopper film 13a at an obtuse angle.

Thus, the underlayer films 16a can be provided on the inner walls (including the tapered surfaces of stopper film 14a) of the grooves 31 and the inner walls (including the tapered surfaces of stopper film 13a) of the contact holes 32 with good coverage. As a result, the conductor members 16b and 16c can be completely filled in the grooves 31 and contact holes 32.

A process for fabricating a semiconductor apparatus according to a sixth embodiment of the invention will now be described. The semiconductor apparatus as shown in FIG. 13 will be fabricated by the process according to the sixth embodiment.

In this process, the grooves 31 and contact holes 32 are formed through the same steps as those in the process for fabricating the semiconductor apparatus according to the first embodiment. Specifically, the steps of FIGS. 16 to 21 are commonly carried out.

Figure 23:
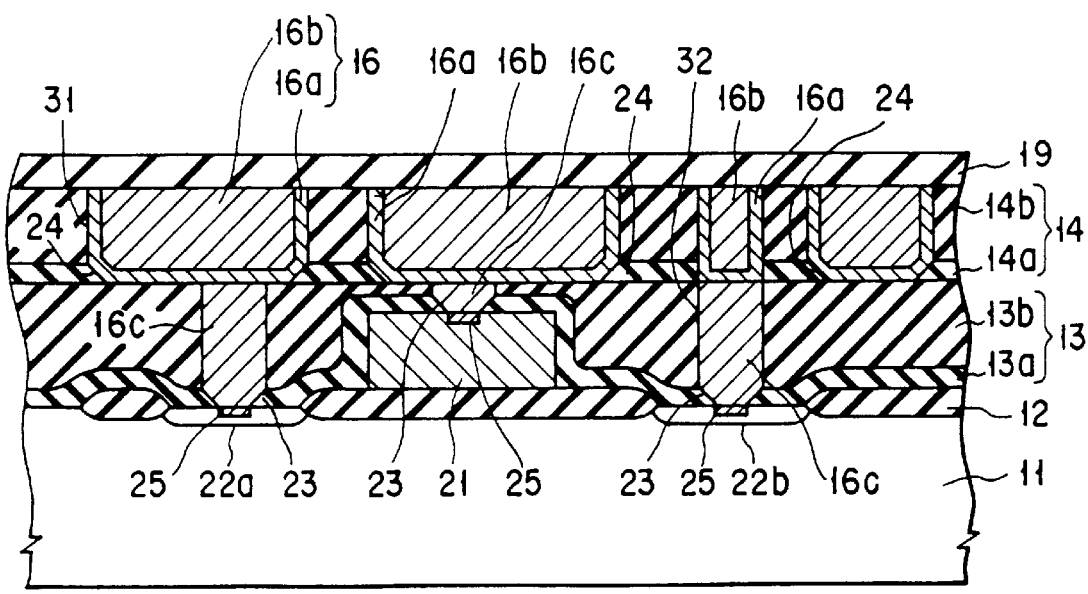
FIG. 23 is a cross-sectional view illustrating a step of a process for fabricating a semiconductor apparatus according to a sixth embodiment of the invention.

As is shown in FIG. 23, a film of a high-melting-point metal (e.g. Ti, Co or W) is formed at least in the contact holes 32 by means of sputtering or CVD. The resultant structure is annealed, for example, for about 30 minutes at about 600° C., thereby forming silicide layers 25 in the gate electrode 21 and source/drain regions 22a and 22b at the bottoms of contact holes 32. Then, using a mixture liquid of $H_2SO_4$ and $H_2O_2$, the remaining high-melting-point metal film, which has not reacted with the silicon substrate 11, is completely removed.

Subsequently, conductor members 16c (of, e.g. tungsten) are selectively formed only within the contact holes 32 by means of plasma CVD. As a result, contact plugs are formed within the contact holes 32. In this embodiment, no underlayer film for the conductor members 16c is needed.

Underlayer films 16a (of, e.g. Ti, Co, W, or SiN) for the wiring elements are formed to a thickness of about 0.1 $\mu$m by means of sputter or CVD. In this case, since the stopper film 14a has the tapered portion at the corners of the grooves 31, the underlayer films 16a are provided on the inner walls of the grooves 31 with good coverage. Then, using a sputtering method and a CVD method, conductor members 16b about 2.0 $\mu$m thick (formed of, e.g. Al—Cu—Si, Al—Cu, or Cu) are formed on the underlayer films 16a. Excess portions of the conductor members 16b are removed by means of CMP (Chemical Mechanical Polishing) and the conductor members 16b are left only in the grooves 31. A wiring protection film (formed of, e.g. $SiO_2$) about 0.3 $\mu$m thick is then formed by means of plasma CVD.

According to the above-described process for fabricating the semiconductor apparatus, the wiring grooves 31 are formed by using the resist film 35 as a mask. The contact holes 32 in which the contact plugs are to be formed in a self-alignment manner in relation to the grooves 31 are formed by using the resist film 35 and stopper film 14a as masks. Thus, the wiring pattern (grooves) and contact plug pattern (contact holes) are formed at the same time, and the number of the manufacturing steps is reduced, thus reducing the manufacturing cost.

In addition, the stopper films 13a and 14a are provided with the tapered portions at the corners of the contact holes 32 and grooves 31. Specifically, the bottom face and side face of each of the contact holes 32 or grooves 31 intersect with the tapered surface of the associated tapered portion of the stopper film 13a or 14a at an obtuse angle.

Thus, the underlayer films 16a can be provided on the inner walls (including the tapered surfaces of stopper film 14a) of the grooves 31 with good coverage. As a result, the conductor members 16b and 16c can be completely filled in the grooves 31 and contact holes 32.

A process for fabricating a semiconductor apparatus according to a seventh embodiment will now be described with reference to FIGS. 24 to 27. FIGS. 24 to 27 are cross-sectional perspective views illustrating in succession the steps of forming the contact holes in the process according to the seventh embodiment.

Figure 24:
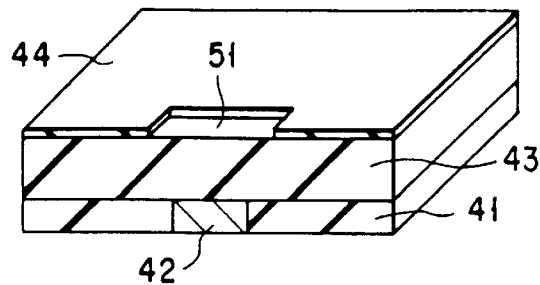
FIGS. 24 to 27 are cross-sectional views illustrating in succession the steps of a process for fabricating a semiconductor apparatus according to a seventh embodiment of the invention.

As is shown in FIG. 24, an insulating film 41 and a lower wiring element 42 are formed on a semiconductor substrate. An insulating film 43 and a stopper film 44 are formed successively on the insulating film 41 including the lower wiring element 42. The stopper film 44 is an insulating protection film for protection against etching in a step for forming a wiring groove.

An opening region 51 including a formation region for a contact hole (for formation of a contact plug), which will be formed subsequently, is formed by photolithography or etching. The width of the opening region 51 is greater than that of the wiring groove to be formed later by etching.

Figure 25:
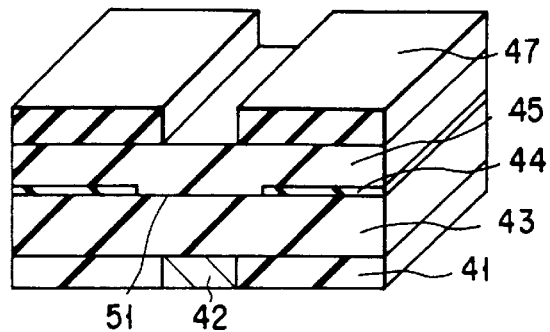

As is shown in FIG. 25, an insulating film 45 is formed to cover the stopper film 44 and opening region 51. A resist film 47 for forming the wiring groove is provided on a predetermined region of the insulating film 45 which is located above the lower wiring element 42.

The resist film 47 is patterned by photolithography. Since the stopper film 44 is far thinner than the insulating film 45 and the insulating film 45 is sufficiently thick, there is little adverse effect due to the presence of stepped portions of the opening region 51. Thus, the flatness of the insulating film 45 is not substantially deteriorated. Therefore, the resist film 47 can be provided on the substantially flat insulating film 45 with uniform thickness and the exact patterning can be achieved without lowering the patterning resolution.

Figure 26:
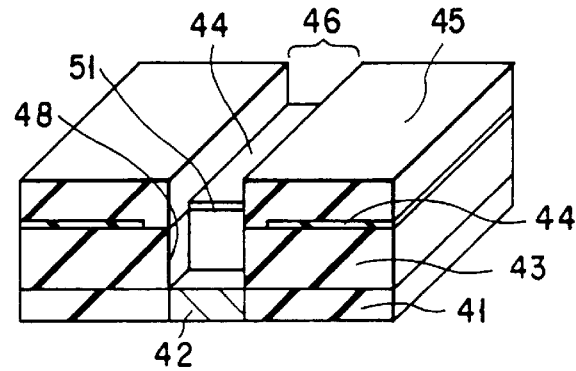

As is shown in FIG. 26, the insulating film 45 is etched by RIE (Reactive Ion Etching) with the resist film 47 used as mask. The progression of etching is stopped by the stopper film 44. Accordingly, a wiring groove 46, to which the stopper film 44 is exposed, is formed. The groove 46 includes a region overlapping the opening region 51 in the stopper film 44. The etching progresses only through the opening region 51 overlapping the groove 46. Thus, a contact hole 48 reaching the lower wiring element 42 is formed along with the groove 46.

Figure 27:
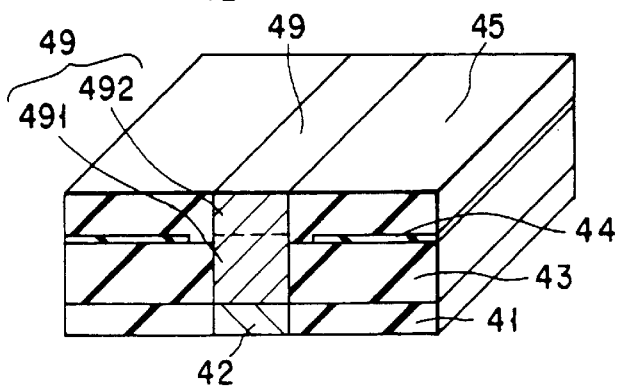

As is shown in FIG. 27, a conductor member 49 (formed of, e.g. Al—Cu, Al—Cu—Si alloy, etc.) is buried in the groove 46 and contact hole 48 in a single step. An excess portion of the conductor member 49 is removed by means CMP, and the conductor member 49 is left only in the groove 46 and contact hole 48. Thereby, a contact plug 491 is formed in the contact hole 48, and an upper wiring element 492 in the groove 46.

According to the above manufacturing process, the upper-side wiring element 492 and contact plug 491 for contact with the lower wiring element 42 can be integrally formed through the same steps, and the manufacturing cost is reduced.

In the above process, the etching rate of RIE for the insulating films 43 and 45 is greater than that for the stopper film 44. For example, the insulating films 43 and 45 are formed of silicon oxide (possibly containing F (fluorine), C (carbon), etc.), and the stopper film 44 are formed of silicon nitride.

First, in this embodiment, the contact hole 48 is formed through the opening region 51 overlapping the groove 46 in a self-alignment manner in relation to the groove 46. Secondly, the width of the opening region 51 of stopper film 44 is made greater than the width of the wiring elements, thus providing an allowance for an alignment error between the upper and lower wiring elements. Thirdly, since the resist film 47 has uniform thickness and the precision in patterning is high, the resolution does not deteriorate. Therefore, the area of contact of the contact plug between fine wiring elements will not deteriorate due to misalignment.

A process for fabricating a semiconductor apparatus according to an eighth embodiment will now be described with reference to FIGS. 28 to 32. FIGS. 28 to 32 are cross-sectional perspective views illustrating in succession the steps of forming a contact hole in the process according to the eighth embodiment. The eighth embodiment differs from the seventh embodiment in that an additional stopper film is provided on the lower wiring element 42.

Figure 28:
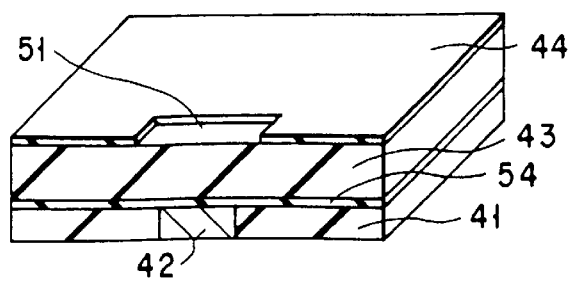

As is shown in FIG. 28, an insulating film 41 and a lower wiring element 42 are formed on a semiconductor substrate. A stopper film 54, an insulating film 43 and a stopper film 44 are formed successively on the insulating film 41 including the lower wiring element 42. The stopper films 44 and 54 are insulating protection films for protection against etching in a step for forming a wiring groove and a contact hole. The stopper films 44 and 54 have the same properties.

An opening region 51 including a formation region for a contact hole (for formation of a contact plug), which will be formed subsequently, is formed by photolithography or etching. The width of the opening region 51 is greater than that of the wiring groove to be formed later by etching.

As is shown in FIG. 29, an insulating film 45 is formed to cover the stopper film 44 and opening region 51. A resist film 47 for forming the wiring groove is provided on a predetermined region of the insulating film 45 which is located above the lower wiring element 42.

The resist film 47 is patterned by photolithography. Since the stopper film 44 is far thinner than the insulating film 45 and the insulating film 45 is sufficiently thick, there is little adverse effect due to the presence of stepped portions of the opening region 51. Thus, the flatness of the insulating film 45 is not substantially deteriorated. Therefore, the resist film 47 can be provided on the substantially flat insulating film 45 with uniform thickness and the exact patterning can be achieved without lowering the patterning resolution.

As is shown in FIG. 30, the insulating film 45 is etched by RIE (Reactive Ion Etching) with the resist film 47 used as mask. The progression of etching is stopped by the stopper film 44. Accordingly, a wiring groove 46, to which the stopper film 44 is exposed, is formed. The groove 46 includes a region overlapping the opening region 51 in the stopper film 44. The etching progresses only through the opening region 51 overlapping the groove 46. Thus, a contact hole 48 reaching the stopper film 54 is formed along with the groove 46.

As is shown in FIG. 31, those portions of the stopper films 44 and 54, which are exposed to the groove 46 and contact hole 48, are etched away simultaneously, and the lower wiring element 42 is exposed to the bottom of the contact hole 48.

As is shown in FIG. 32, a conductor member 49 (formed of, e.g. Al—Cu, Al—Cu—Si alloy, etc.) is buried in the groove 46 and contact hole 48 in a single step. An excess portion of the conductor member 49 is removed by means CMP, and the conductor member 49 is left only in the groove 46 and contact hole 48. Thereby, a contact plug 491 is formed in the contact hole 48, and an upper wiring element 492 in the groove 46.

In the above process, the etching rate of RIE for the insulating films 43 and 45 is greater than that for the stopper films 54 and 44. For example, the insulating films 43 and 45 are formed of silicon oxide (possibly containing F (fluorine), C (carbon), etc.), and the stopper films 54 and 44 are formed of silicon nitride.

In the eighth embodiment, the same advantages as in the seventh embodiment are obtained.

The number of manufacturing steps in the eighth embodiment is greater than that in the seventh embodiment by one: a step of etching the stopper film 54. However, the possibility of over-etching in forming the contact hole 48 is reduced.

Figure 33:
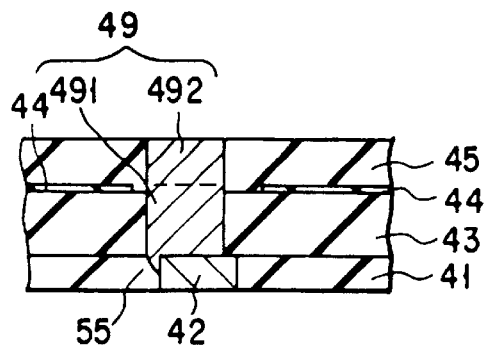
FIG. 33 is a cross-sectional view illustrating a step of the process for fabricating the semiconductor apparatus according to the seventh embodiment of the invention.
Figure 34:
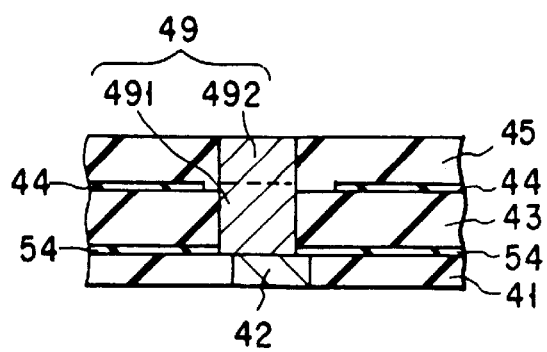
FIG. 34 is a cross-sectional view illustrating a step of the process for fabricating the semiconductor apparatus according to the eighth embodiment of the invention.

Suppose that the position of the formed groove 46 is displaced from the designed position of the contact hole 48. In this case, in the seventh embodiment, over-etching (55) may occur, as illustrated in FIG. 33. In the eighth embodiment, however, the stopper film 54 is removed in a selective etching step and no over-etching occurs, as illustrated in FIG. 34. In the seventh embodiment, if the shape of the contact plug, as shown in FIG. 33, is considered to be permissible, there is an advantage in that the area of contact between the lower wiring element 42 and conductor member 49 does not decrease even if the contact hole 48 is not formed at the design position.

Figure 35:
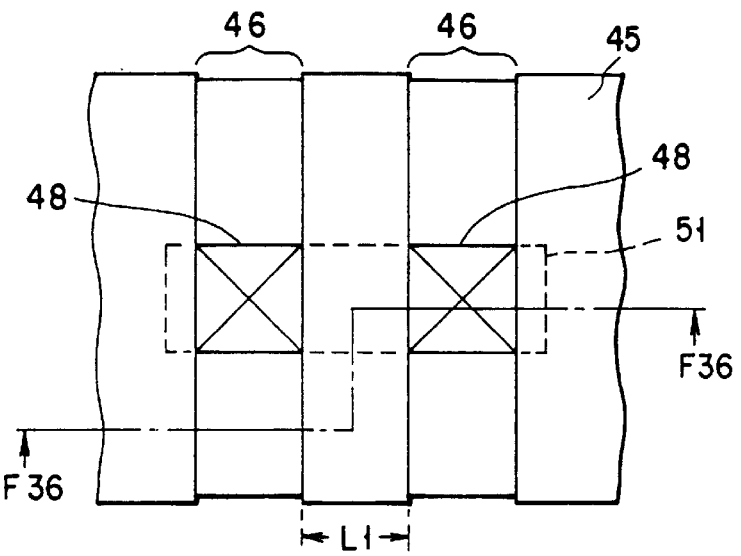
FIG. 35 is a plan view illustrating a process of fabricating a semiconductor apparatus according to a ninth embodiment of the invention.
Figure 36:
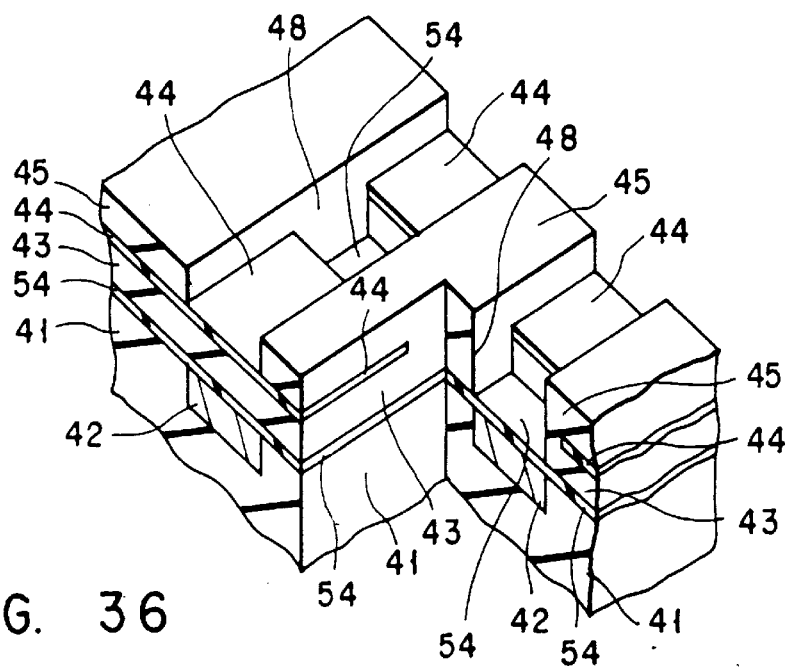
FIG. 36 is a cross-sectional perspective view taken along line F36—F36 in FIG. 35.

A process for fabricating a semiconductor apparatus according to a ninth embodiment of the invention will now be described. FIG. 35 is a plan view showing wiring grooves and contact holes in the case where two mutually opposed plugs are formed on two parallel wiring elements, and FIG. 36 is a cross-sectional perspective view taken along line F36—F36 in FIG. 35. In the state illustrated in FIG. 36, the stopper films exposed to the grooves 48 and the bottoms of contact holes 48 have not yet been removed, for the purpose of description.

In FIGS. 35 and 36, the parts common to those shown in FIGS. 28 to 32 are denoted by like reference numerals. In this embodiment, an opening region 51 is formed in the stopper film 44 so as to cross the two wiring grooves 46 (indicated by broken line in FIG. 35). The opening region 51 is called a slit region 51. A process for fabricating this semiconductor apparatus will now be described.

FIGS. 37 to 40 are cross-sectional views illustrating in succession the steps of forming contact holes and buried wiring elements in the process according to the ninth embodiment of the invention.

Figure 37:
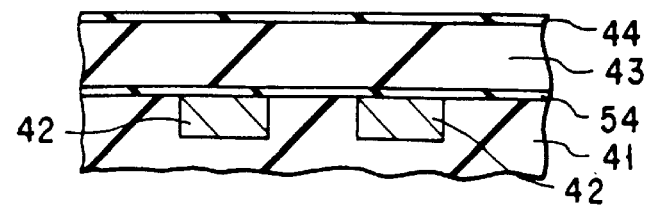
FIGS. 37 to 40 are cross-sectional views illustrating in succession the steps of forming contact holes and buried wiring elements in the process according to the ninth embodiment of the invention.

As is shown in FIG. 37, two lower wiring elements 42 formed of Al alloy (e.g. Al—Cu—Si, Al—Cu, etc.) are formed in wiring grooves formed in an insulating film 41. A stopper film 54, an insulating film 43 and a stopper film 44 are successively laminated on the insulating film 41 including the lower wiring elements 42. The stopper films 54 and 44 are protection films against etching in forming wiring grooves in a later step.

Figure 38:
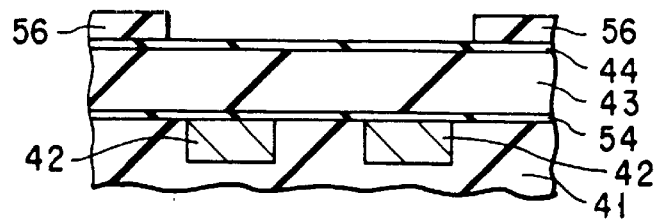

As is shown in FIG. 38, a resist film 56 is coated on the stopper film 44. A pattern of the slit region 51 including formation regions of two contact holes (for formation of contact plugs), which will face each other on the two wiring elements 42, are formed on the resist film 56 by means of lithography. The resist film 56 with uniform thickness is provided on the flat stopper film 44. Accordingly, a wide exposure D.O.F (Domain of Focus) and high resolution are achieved in the resist patterning.

Figure 39:
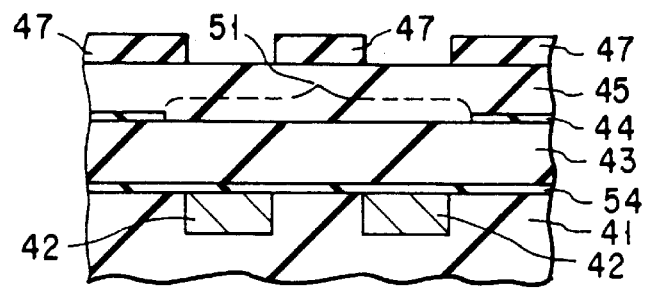

As is shown in FIG. 39, the stopper film 44 is etched by RIE with the resist film 56 used as mask. The condition for the RIE is determined such that the etching rate for the stopper film 44 is much higher than that for the insulating film 43. Thus, the slit region 51 is formed. Thereafter, an insulating film 45 is formed to cover the stopper film 44 and slit region 51.

Subsequently, a resist film 47 for forming upper wiring grooves is patterned on a predetermined region of the insulating film 45, i.e. a region above the two wiring elements 42. In this case, since the stopper film 44 is much thinner than the insulating film 45, there is little adverse effect due to the presence of stepped portions of the slit region 51. Thus, the flatness of the insulating film 45 is not substantially deteriorated. Therefore, the resist film 47 can be provided on the substantially flat insulating film 45 with uniform thickness and the exact patterning can be achieved without lowering the patterning resolution.

Then, the insulating film 45 is etched by RIE (Reactive Ion Etching) with the resist film 47 used as mask. The progression of etching is stopped by the stopper film 44, except for the slit region 51. Accordingly, wiring grooves 46, to which the stopper film 44 is exposed, are formed. The grooves 46 include a region overlapping the slit region 51 in the stopper film 44. The etching progresses only through the slit region 51 overlapping the groove 46. Thus, contact holes 48 reaching the stopper film 54 are formed along with the grooves 46 (see FIG. 36). Subsequently, those portions of the stopper film 54, which are exposed to the bottoms of the contact hole 48, are etched away selectively, and the lower wiring elements 42 are exposed to the bottoms of the contact holes 48. At this time, the stopper film 44 exposed to the bottoms of the grooves 46 may be etched at the same time.

Figure 40:
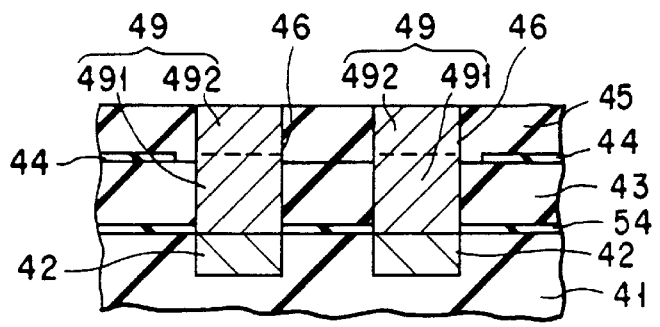

As is shown in FIG. 40, conductor members 49 (formed of, e.g. Al—Cu, Al—Cu—Si alloy, etc.) are buried in the grooves 46 and contact holes 48 in a single step. Excess portions of the conductor members 49 are removed by means CMP, RIE or CDE (Chemical Dry Etching) and the conductor members 49 are left only in the grooves 46 and contact holes 48. Thereby, contact plugs 491 are formed in the contact holes 48, and upper wiring elements 492 in the grooves 46.

In the above process, the etching rate of RIE for the insulating films 43 and 45 is greater than that for the stopper films 54 and 44. For example, the insulating films 43 and 45 are formed of silicon oxide (possibly containing F (fluorine), C (carbon), etc.), and the stopper films 54 and 44 are formed of silicon nitride.

If the etching rate for the stopper film 44 is E3, the thickness of the insulating film 43 is T and the etching rate for the insulating film 43 is E2, the thickness of the stopper film 44 must be greater than the value calculated by (E3/E2)×T.

The insulating films 43 and 45 and stopper films 54 and 44 may be formed of materials other than silicon-based materials, e.g. organic materials. The material of the insulating films 43 and 45 is not necessarily the same as that of the stopper films 54 and 44. However, in the etching steps of forming the wiring grooves 46 and contact holes 48, the etching rate for the stopper films 54 and 44 must be lower than that for the insulating films 43 and 45.

According to the ninth embodiment, the same advantages as with the seventh embodiment are obtained. In addition, the following advantages are enhanced by the structure of the slit region 51. The slit region 51 is formed to cross the two wiring elements with an allowance for positioning. The resist film 47 is formed with uniform thickness and the patterning precision is good. Thus, the resolution does not deteriorate. In addition, the distance between the mutually opposed contact holes 48 is equal to that between the wiring grooves 46 without fail. Thus, even if contact holes are formed to face parallel wiring elements, the distance between the wiring grooves 46 can be set at the resolution limit space L1 (see FIG. 35). As a result, the integration density of semiconductor devices can be increased, as compared to the prior art.

Figure 41:
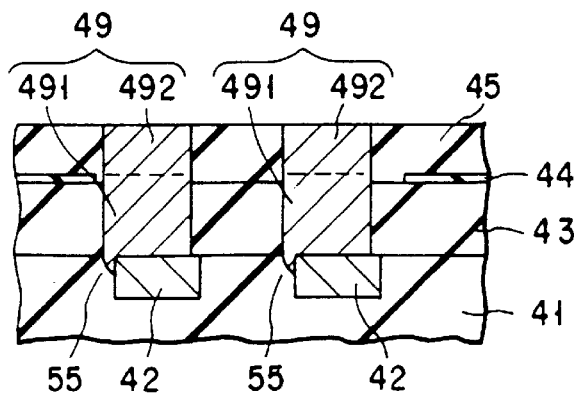
FIG. 41 is a cross-sectional view illustrating a step of a process for fabricating a semiconductor apparatus according to a tenth embodiment of the invention.

FIG. 41 illustrates a process according to a tenth embodiment of the invention wherein the stopper film 54 is not provided. The process according to the tenth embodiment is a modification of the process according to the ninth embodiment. If the grooves 46 are displaced and consequently the contact holes 48 are displaced, over-etching (55) may occur, as illustrated in FIG. 41. If the shape of the illustrated over-etching portions is permitted, the displacement of the contact holes 48 does not lead to reduction in contact area between the lower wiring elements 42 and conductor members 49.

A process for fabricating a semiconductor apparatus according to an eleventh embodiment of the invention will now be described. In this embodiment, Cu, which has a lower resistance than an Al alloy, is used as material of buried wiring elements. Since Cu diffuses in a silicon oxide film at a very high rate, a diffusion prevention film for preventing diffusion of Cu into the silicon oxide film is needed in the case of forming wiring elements in the silicon oxide film.

Figure 42:
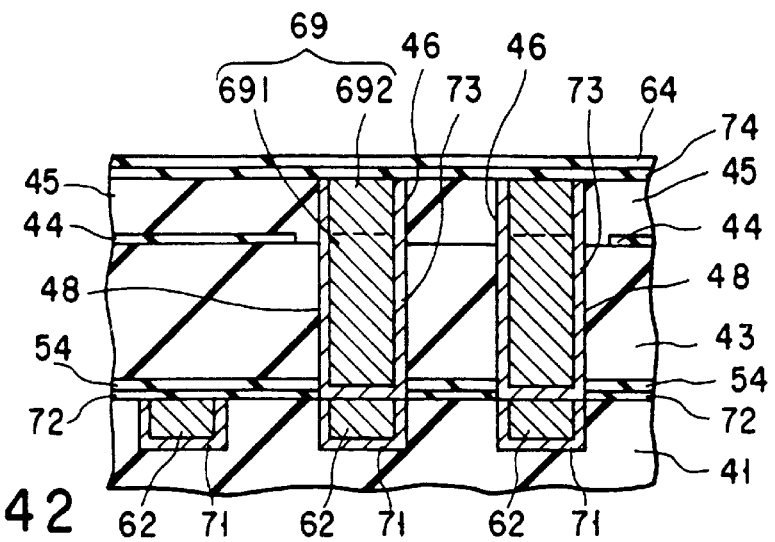
FIG. 42 is a cross-sectional view illustrating a process of fabricating a semiconductor apparatus according to an eleventh embodiment of the invention.

FIG. 42 is a cross-sectional view according to the eleventh embodiment of the invention. Since lower wiring elements are formed of Cu, the wiring elements are surrounded by diffusion prevention films 71. A diffusion prevention film 72 is provided over an insulating film 41 including the lower wiring elements 62. A stopper film 54, an insulating film 43, a stopper film 44 (having a slit region 51) and an insulating film 45 are successively laminated on the diffusion prevention film 72. The process for forming these films is the same as that in the fifth embodiment.

After the wiring grooves 46 and contact holes 48 are formed, diffusion prevention films 73 are coated on the inner walls of the wiring grooves and contact holes as underlayer films by means of CVD (Chemical Vapor Deposition), sputtering, etc. before conductors of Cu are buried. Then, conductor members 69 (Cu) are buried in the grooves 46 and contact holes 48 through the same steps.

Excess portions of the conductor members 69 are removed by means CMP, RIE or CDE (Chemical Dry Etching) and the conductor members 69 are left only in the grooves 46 and contact holes 48. Thereby, contact plugs 691 are formed in the contact holes 48, and upper wiring elements 692 in the grooves 46.

A diffusion prevention film 74 is coated on the insulating film 45 including the upper wiring elements 692. In FIG. 42, a stopper film 64 for the upper wiring elements is formed on the diffusion prevention film 74.

The diffusion prevention films 71 and 73 are electrically conductive and may be formed of a Ti-based material, W-based material or Co-based material. The thickness of each of the diffusion prevention films 71 and 73 is 10 nm to 100 nm. The diffusion prevention films 72 and 74 are insulating and may be formed of silicon nitride, or a silicon nitride material containing fine Ti crystals or fine W crystals. The fine Ti (or W) crystals are discretely contained in SiN in order to trap Cu atoms.

In FIG. 42, the diffusion prevention film and stopper film are separately provided. However, these may be replaced with a single film having both functions of the etching stopper and diffusion prevention films. For example, if the stopper film 54 shown in FIG. 42 is a silicon nitride film, the diffusion prevention film 72 is not needed.

A process for fabricating a semiconductor apparatus according to a twelfth embodiment of the invention will now be described. In this embodiment, the stopper film (44) for determining the positions of the upper wiring groove and contact hole is formed to have contact hole formation regions having the designed size.

FIGS. 43 to 46 are cross-sectional views illustrating in succession the steps of forming contact holes and buried wiring elements according to the twelfth embodiment. The parts common to those in the fifth embodiment are denoted by like reference numerals.

Figure 43:
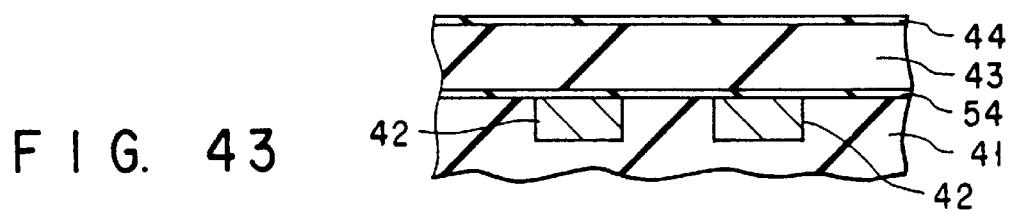
FIGS. 43 to 46 are cross-sectional views illustrating in succession the step of forming contact holes and buried wiring elements in a process according to an twelfth embodiment of the invention.

As is shown in FIG. 43, two lower wiring elements 42 formed of Al alloy are formed in wiring grooves formed in an insulating film 41. A stopper film 54, an insulating film 43 and a stopper film 44 are successively laminated on the insulating film 41 including the lower wiring elements 42. The stopper films 54 and 44 are protection films against etching in forming wiring grooves in a later step.

Figure 44:
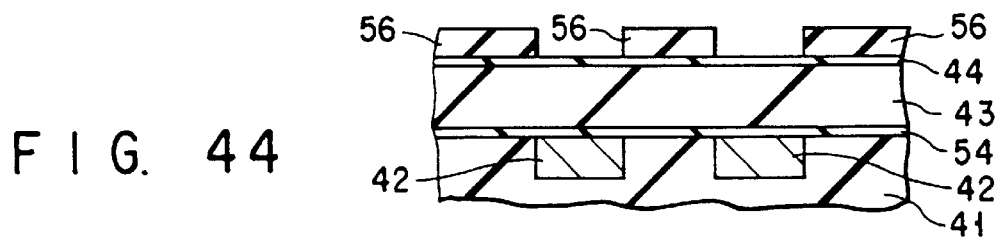

As is shown in FIG. 44, a resist film 56 is coated on the stopper film 44. A pattern of formation regions of two contact holes (for formation of contact plugs), which will face each other on the two wiring elements 42, are formed on the resist film 56 by means of lithography. The resist film 56 with uniform thickness is provided on the flat stopper film 44. Accordingly, a wide exposure D.O.F (Domain of Focus) and high resolution are achieved in the resist patterning.

Figure 45:
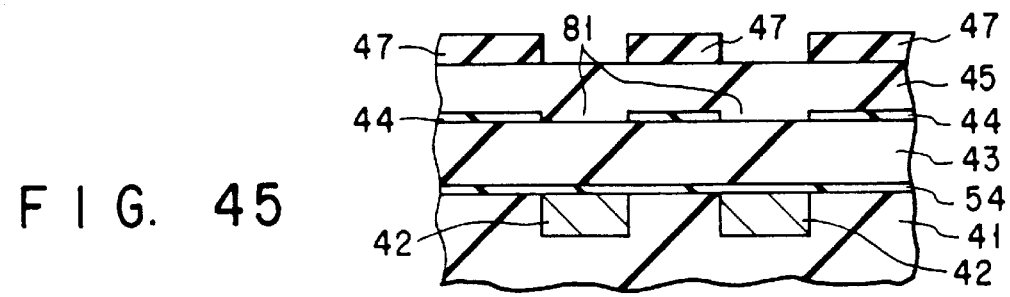

As is shown in FIG. 45, the stopper film 44 is etched with the resist film 56 used as mask. Thus, contact regions 81 are formed above the lower wiring elements 42. Thereafter, an insulating film 45 is formed to cover the stopper film 44 and contact regions 81.

Subsequently, a resist film 47 is patterned on a predetermined region of the insulating film 45 in order to form upper wiring grooves passing through the contact regions 81. In this case, since the stopper film 44 is much thinner than the insulating film 45, there is little adverse effect due to the presence of stepped portions of the contact regions 81. Thus, the flatness of the insulating film 45 is not substantially deteriorated. Therefore, the resist film 47 can be provided on the substantially flat insulating film 45 with uniform thickness and the exact patterning can be achieved without lowering the patterning resolution.

Then, the insulating film 45 is etched by RIE (Reactive Ion Etching) with the resist film 47 used as mask. The progression of etching is stopped by the stopper film 44, except for the contact regions 81. Accordingly, wiring grooves 46, to which the stopper film 44 is exposed, are formed. The etching progresses only through the contact regions 81. Thus, contact holes 48 reaching the stopper film 54 are formed along with the grooves 46.

Subsequently, those portions of the stopper film 54, which are exposed to the bottoms of the contact holes 48, are etched away selectively, and the lower wiring elements 42 are exposed to the bottoms of the contact holes 48. At this time, the stopper film 44 exposed to the bottoms of the grooves 46 may be etched at the same time.

Figure 46:
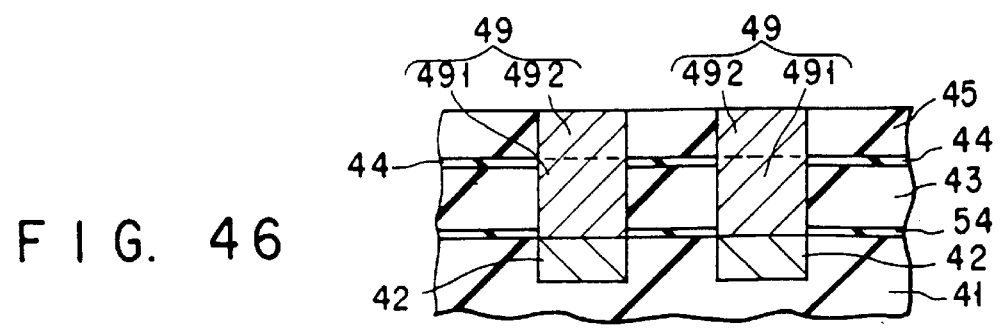

As is shown in FIG. 46, conductor members 49 (formed of, e.g. Al—Cu, Al—Cu—Si alloy, etc.) are buried in the grooves 46 and contact holes 48 in a single step. Excess portions of the conductor members 49 are removed by means CMP, RIE or CDE (Chemical Dry Etching) and the conductor members 49 are left only in the grooves 46 and contact holes 48. Thereby, contact plugs 491 are formed in the contact holes 48, and upper wiring elements 492 in the grooves 46.

According to this process, like the preceding processes, the manufacturing cost is reduced. In addition, in this process, the precision in alignment during manufacture is very high and high reliability is achieved. Needless to say, the resolution does not deteriorate since the precision in patterning of the resist films 47 and 56 is high. If the alignment is precise, the contact holes can be formed according to design dimensions.

A process for fabricating a semiconductor apparatus according to a 13th embodiment of the invention will now be described with reference to FIG. 47. In this embodiment, the process of the twelfth embodiment is applied to the process of the eleventh embodiment.

Figure 47:
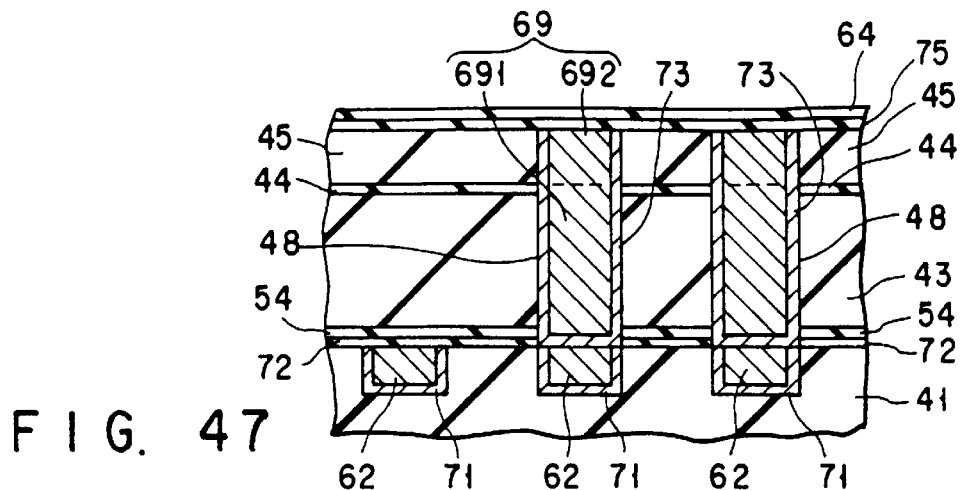
FIG. 47 is a cross-sectional view illustrating a process of fabricating a semiconductor apparatus according to a 13th embodiment of the invention.

In FIG. 47, since lower wiring elements 62 are formed of Cu, the wiring elements 62 are surrounded by diffusion prevention films 71. A diffusion prevention film 72 is provided over an insulating film 41 including the lower wiring elements 62. A stopper film 54, an insulating film 43, a stopper film 44 (having contact regions 81) and an insulating film 45 are successively laminated on the diffusion prevention film 72. The process for forming these films is the same as that in the twelfth embodiment.

After the wiring grooves 46 and contact holes 48 are formed, diffusion prevention films 73 are coated on the inner walls of the wiring grooves and contact holes as underlayer films by means of CVD (Chemical Vapor Deposition), sputtering, etc. before conductors of Cu are buried. Then, conductor members 69 (Cu) are buried in the grooves 46 and contact holes 48 through the same steps.

Excess portions of the conductor members 69 are removed by means CMP, RIE or CDE (Chemical Dry Etching) and the conductor members 69 are left only in the grooves 46 and contact holes 48. Thereby, contact plugs 691 are formed in the contact holes 48, and upper wiring elements 692 in the grooves 46.

A diffusion prevention film 74 is coated on the insulating film 45 including the upper wiring elements 692. In FIG. 42, a stopper film 64 for the upper wiring elements is formed on the diffusion prevention film 74.

In FIG. 47, the diffusion prevention film and stopper film are separately provided. However, these may be replaced with a single film having both functions of the etching stopper and diffusion prevention films.

Figure 48:
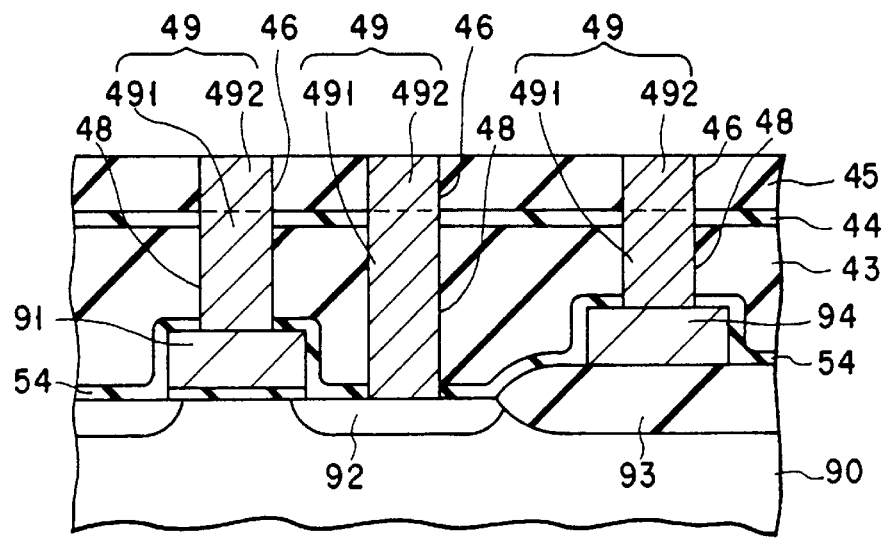
FIG. 48 is a cross-sectional view illustrating a first applied example of the process of fabricating the semiconductor apparatus according to the present invention.
Figure 49:
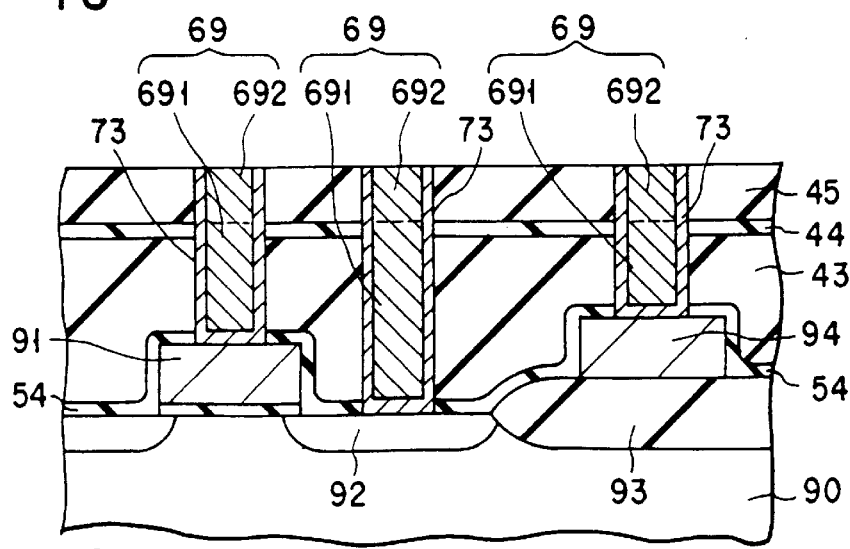
FIG. 49 is a cross-sectional view illustrating a second applied example of the process of fabricating the semiconductor apparatus according to the present invention.

In each of the processes of the above embodiments, the lower wiring element may have various structures as conductor region. Specifically, the lower wiring element is not limited to a wiring layer between insulating films, and may be an impurity diffusion layer on a substrate or a gate electrode of a device. FIGS. 48 and 49 are cross-sectional views illustrating applied examples.

In FIG. 48, contact plugs 491 are formed on a gate electrode 91 of a MOS transistor, a diffusion layer 92 on a substrate 90 and a wiring layer 94 on an insulating film 93, respectively. A stopper film 44 having opening regions, which determine the positions of the upper wiring grooves 46 and contact holes 48, is formed in an interlayer insulating film (insulating films 43 and 45). The stopper film 54 is a protection film against etching for forming the contact holes 48. In a later step, the stopper film 54 will be selectively etched in accordance with the size of each contact hole 48. In FIG. 49, the conductor members 49 shown in FIG. 48 are replaced with conductor members 69 of Cu. The conductor members 69 of Cu are surrounded by diffusion prevention films 73.

As has been described above, the following advantages can be obtained by the semiconductor apparatuses and the manufacturing processes therefor according to the present invention:

(1) A wiring groove is formed with a resist film used as mask, and a contact hole is formed with the resist film and a stopper film used as masks, in a self-alignment manner in relation to the wiring groove. Accordingly, a wiring pattern (groove) and a contact plug pattern (contact hole) are formed at the same time, and the number of manufacturing steps is reduced, thus contributing to reduction in manufacturing cost.

(2) Since resist films for forming the stopper film and wiring groove are uniform in thickness, the precision of patterning is good and the resolution hardly deteriorates.

(3) A slit region having a greater width than the wiring groove is formed in the stopper film below the wiring groove, it is possible to prevent reduction in contact area between the contact plug and the upper wiring even if misalignment occurs in a lithographing step.

(4) When mutually opposed contact holes are formed below parallel wiring elements, a slit region is formed to cross the two wiring elements. Thus, the distance between the mutually opposed contact holes becomes equal to that between the wiring grooves without fail. Thus, even if contact holes are formed to face parallel wiring elements by the process of above (3), the distance between the wiring grooves can be set at the resolution limit space. As a result, the integration density of semiconductor devices can be increased.

(5) The stopper film is provided with tapered portions at the corners of the groove and contact holes. Specifically, the bottom face and side face of each of the groove and contact hole intersect with the tapered surface of the tapered portion of the stopper film at an obtuse angle. Thus, an underlayer film for wiring can be provided on the inner walls of the groove and contact hole with uniform thickness and good coverage.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor apparatus comprising:
   a first conductive region provided at one of a region in a semiconductor substrate and a region on the semiconductor substrate;
   a second conductive region provided above the first conductive region;
   an interlayer insulating film provided between the first and second conductive regions;
   an insulating protection film provided in the interlayer insulating film contacting with the first conductive region and having an etching rate different from that of the interlayer insulating film, the protection film having an opening region formed so that a tapered side wall remains at a corner defined by a bottom face and a side face of the opening region in the protection film;
   a contact hole penetrating the interlayer insulating film through the opening region in the protection film; and
   a conductor member for electrically connecting the first conductive region and the second conductive region via the contact hole and the opening region,
   wherein the contact hole penetrates the interlayer insulating film substantially vertically with respect to the semiconductor substrate, and
   the opening region extends through the protection film substantially vertically with respect to the semiconductor substrate except the corner of the protection film.

2. The semiconductor apparatus according to claim 1, further comprising an additional protection film provided on the first conductive region.

3. The semiconductor apparatus according to claim 1, further comprising an additional protection film provided on the first conductive region,
   wherein the additional protection film is provided with a tapered portion at a corner defined by a bottom face and a side face of the contact hole, the tapered portion having a tapered surface intersecting with the bottom face and the side face of the contact hole at an obtuse angle, and
   the tapered side wall of the protection film is further defined by a bottom face and a side face of the first conductive region, the tapered side wall having a tapered surface intersecting with the bottom face and the side face of the first conductive region at an obtuse angle.

4. The semiconductor apparatus according to any one of claims 1 to 3, wherein the second conductive region is located within a wiring groove formed in the interlayer insulating film.

5. The semiconductor apparatus according to any one of claims 1 to 3, wherein said conductor member is surrounded by an underlayer film.

6. The semiconductor apparatus according to claim 5, wherein said underlayer film is formed of a conductor consisting substantially of one of Ti, W and Co.

7. The semiconductor apparatus according to any one of claims 1 and 2, wherein the opening region of the protection film has an area greater than the dimensions of the contact hole.

8. The semiconductor apparatus according to any one of claims 1 and 2, wherein said protection film is in contact with the second conductive region.

9. The semiconductor apparatus according to claim 2, wherein said additional protection film is put in contact with the first conductive region, and a side face of an opening portion in the additional protection film is put in contact with the conductor member.

10. The semiconductor apparatus according to any one of claims I to 3, wherein the second conductive region is located within a wiring groove formed in the interlayer insulating film, there are provided at least two said wiring grooves arranged in parallel, and there are provided at least two contact holes facing bottom portions of said at least two grooves, respectively.

11. The semiconductor apparatus according to claim 1, wherein said opening region of the protection film is a slit-like opening region crossing at least two said grooves, and said contact hole is defined by a region shared by the opening region and said at least two grooves.

12. A semiconductor apparatus comprising:
    a semiconductor substrate;
    a first stopper film provided on the semiconductor substrate;
    a first insulating film provided on the first stopper film;
    a second stopper film provided on the first insulating film;
    a second insulating film provided on the second stopper film;
    a groove formed in the second stopper film and the second insulating film;
    a contact hole formed in the first stopper film and the first insulating film and extending from the bottom of the groove to the semiconductor substrate; and a conductor member filled in the groove and the contact hole, wherein the first stopper film is provided with a first tapered portion at a first corner defined by a bottom face and a side face of the contact hole, the first tapered portion having a first tapered surface intersecting with the bottom face and the side face of the contact hole at an obtuse angle, the second stopper film is provided with a second tapered portion at a second corner defined by a bottom face and a side face of the groove, the second tapered portion having a second tapered surface intersecting with the bottom face and the side face of the groove at an obtuse angle, and the side faces of the groove and the contact hole are substantially vertical except said first and second corners of the groove and the contact hole.

13. A semiconductor apparatus comprising:

a semiconductor substrate;

a conductive wiring element provided on the semiconductor substrate;

a first stopper film provided on the wiring element;

a first insulating film provided on the first stopper film;

a second stopper film provided on the first insulating film;

a second insulating film provided on the second stopper film;

a groove formed in the second stopper film and the second insulating film;

a contact hole formed in the first stopper film and the first insulating film and extending from the bottom of the groove to the wiring element; and a conductor member filled in the groove and the contact hole, wherein the first stopper film is provided with a first tapered portion at a first corner defined by a bottom face and a side face of the contact hole, the first tapered portion having a first tapered surface intersecting with the bottom face and the side face of the contact hole at an obtuse angle, the second stopper film is provided with a second tapered portion at a second corner defined by a bottom face and a side face of the groove, the second tapered portion having a second tapered surface intersecting with the bottom face and the side face of the groove at an obtuse angle, and the side faces of the groove and the contact hole are substantially vertical except said first and second corners of the groove and the contact hole.

14. The semiconductor apparatus according to any one of claims 12 and 13, wherein said conductor member comprises an underlayer film provided on the bottom face and the side face of the contact hole and on the bottom face and the side face of the groove, and a metal film filled in the contact hole and the groove.

15. The semiconductor apparatus according to any one of claims 12 and 13, wherein said conductor member comprises a first metal film filled in the contact hole, an underlayer film provided on the bottom face and side face of the groove and on the first metal film, and a second metal film filled in the groove.

16. A semiconductor apparatus comprising:

a semiconductor substrate;

a stopper film provided on the semiconductor substrate;

an insulating film provided on the stopper film; and a contact hole formed in the stopper film and the insulating film and extending from a surface of the insulating film to the semiconductor substrate; and a conductor member filled in the contact hole, wherein the stopper film is provided with a tapered portion at a corner defined by a bottom face and a side face of the contact hole, the tapered portion having a tapered surface intersecting with the bottom face and the side face of the contact hole at an obtuse angle, and the side face of the contact hole is substantially vertical except said corner of the contact hole.

17. The semiconductor apparatus according to claim 16, wherein said conductor member comprises an underlayer film provided on the bottom face and the side face of the contact hole, and a metal film filled in the contact hole.

18. A semiconductor apparatus comprising:

a semiconductor substrate;

a first insulating film provided on the semiconductor substrate;

a stopper film provided on the first insulating film;

a second insulating film provided on the stopper film;

a groove formed in the stopper film and the second insulating film and extending from a surface of the second insulating film to a surface of the first insulating film; and a conductor member filled in the groove, wherein the stopper film is provided with a tapered portion at a corner defined by a bottom face and a side face of the groove, the tapered portion having a tapered surface intersecting with the bottom face and the side face of the groove at an obtuse angle, and the side face of the groove is substantially vertical except said corner of the groove.

19. The semiconductor apparatus according to claim 18, wherein said conductor member comprises an underlayer film provided on the bottom face and the side face of the groove, and a metal film filled in the groove.

* * * * *